(12) United States Patent
Kim et al.

(10) Patent No.: US 10,236,298 B2
(45) Date of Patent: Mar. 19, 2019

(54) NON-VOLATILE MEMORY DEVICES WITH VERTICALLY INTEGRATED CAPACITOR ELECTRODES

(71) Applicant: Samsung Electronics Co., Ltd., Suwon-si, Gyeonggi-do (KR)

(72) Inventors: Hyun-Suk Kim, Hwaseong-si (KR); Joon-Hee Lee, Seongnam-si (KR); Kee-Jeong Rho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/997,725

(22) Filed: Jun. 5, 2018

(65) Prior Publication Data

US 2018/0308857 A1    Oct. 25, 2018

Related U.S. Application Data

(63) Continuation of application No. 15/589,528, filed on May 8, 2017, now Pat. No. 10,014,315, which is a (Continued)

(30) Foreign Application Priority Data

May 2, 2014  (KR) ........................ 10-2014-0053620

(51) Int. Cl.
| | |
|---|---|
| H01L 27/11573 | (2017.01) |
| H01L 49/02 | (2006.01) |
| H01L 27/11519 | (2017.01) |
| H01L 27/11526 | (2017.01) |
| H01L 27/11556 | (2017.01) |
| H01L 27/11565 | (2017.01) |
| H01L 27/1157 | (2017.01) |

(Continued)

(52) U.S. Cl.
CPC .... *H01L 27/11573* (2013.01); *H01L 27/1157* (2013.01); *H01L 27/11519* (2013.01);
(Continued)

(58) Field of Classification Search
None
See application file for complete search history.

(56) References Cited

U.S. PATENT DOCUMENTS

| | | | |
|---|---|---|---|
| 7,615,440 B2 | 11/2009 | Felsner et al. | |
| 7,713,815 B2 | 5/2010 | Lehr et al. | |

(Continued)

FOREIGN PATENT DOCUMENTS

| | | |
|---|---|---|
| JP | 2000-031434 | 1/2000 |
| JP | 2009-500824 | 1/2009 |

(Continued)

*Primary Examiner* — Angel Roman
(74) *Attorney, Agent, or Firm* — Myers Bigel, P.A.

(57) ABSTRACT

Provided is a vertical non-volatile memory device in which a capacitor constituting a peripheral circuit region is formed as a vertical type so that an area occupied by the capacitor in the entire device can be reduced as compared with a planar capacitor. Thus, a non-volatile memory device may be highly integrated and have a high capacity. The device includes a substrate having a cell region and a peripheral circuit region, a memory cell string including a plurality of vertical memory cells formed in the cell region and channel holes formed to penetrate the vertical memory cells in a first direction vertical to the substrate, an insulating layer formed in the peripheral circuit region on the substrates at substantially the same level as an upper surface of the memory cell string, and a plurality of capacitor electrodes formed on the peripheral circuit region to penetrate at least a portion of the insulating layer in the first direction, the plurality of capacitor electrodes extending parallel to the channel holes. The plurality of capacitor electrodes are spaced apart from one another in a second direction parallel to the substrate, and the insulating layer is interposed between a pair of adjacent capacitor electrodes from among the plurality of capacitor electrodes.

12 Claims, 14 Drawing Sheets

Related U.S. Application Data continuation of application No. 14/702,038, filed on May 1, 2015, now Pat. No. 9,659,954.

(51) Int. Cl.
*H01L 27/11582* (2017.01)
*H01L 27/11521* (2017.01)
*H01L 27/11568* (2017.01)

(52) U.S. Cl.
CPC .. *H01L 27/11521* (2013.01); *H01L 27/11526* (2013.01); *H01L 27/11556* (2013.01); *H01L 27/11565* (2013.01); *H01L 27/11568* (2013.01); *H01L 27/11582* (2013.01); *H01L 28/60* (2013.01); *H01L 28/91* (2013.01)

(56) References Cited

U.S. PATENT DOCUMENTS

| | | | |
|---|---|---|---|
| 8,093,643 B2 | 1/2012 | Baker et al. | |
| 8,343,845 B2 | 1/2013 | Kim et al. | |
| 8,470,667 B2 | 6/2013 | Koo | |
| 8,810,002 B2 | 8/2014 | Jou et al. | |
| 10,014,315 B2 * | 7/2018 | Kim | H01L 27/1157 |
| 2008/0180878 A1 | 7/2008 | Wang et al. | |
| 2011/0018052 A1 | 1/2011 | Fujiwara et al. | |
| 2012/0161281 A1 | 6/2012 | Hasunuma | |
| 2012/0168831 A1 | 7/2012 | Ahn | |
| 2013/0017629 A1 | 1/2013 | Pyo et al. | |
| 2013/0049086 A1 | 2/2013 | Ahn et al. | |
| 2013/0130468 A1 | 5/2013 | Higashitani et al. | |
| 2013/0258796 A1 | 10/2013 | Hioka et al. | |
| 2014/0284674 A1 | 9/2014 | Iwai | |
| 2014/0284688 A1 | 9/2014 | Hirai et al. | |

FOREIGN PATENT DOCUMENTS

| | | |
|---|---|---|
| JP | 2013-207123 | 10/2013 |
| KR | 1020100105090 A | 9/2010 |
| KR | 1020110091214 A | 8/2011 |
| KR | 1020130023995 A | 3/2013 |
| WO | 2007/005141 A1 | 1/2007 |

* cited by examiner

NON-VOLATILE MEMORY DEVICES WITH VERTICALLY INTEGRATED CAPACITOR ELECTRODES

REFERENCE TO PRIORITY APPLICATIONS

This application is a continuation of U.S. patent application Ser. No. 15/589,528, filed May 8, 2017, which itself is a continuation of U.S. patent application Ser. No. 14/702,038, filed May 1, 2015, now U.S. Pat. No. 9,659,954, which itself claims the benefit of Korean Patent Application No. 10-2014-0053620, filed on May 2, 2014, in the Korean Intellectual Property Office, the disclosures of each are incorporated herein in their entireties by reference.

BACKGROUND

The inventive concept relates to non-volatile memory devices and, more particularly, to vertical non-volatile memory devices in which a vertical capacitor is formed in a peripheral circuit region.

Despite the continuous reduction in volume of electronic products, the electronic products need to process large amounts of data. Thus, it is necessary to increase the integration density of semiconductor memory devices used for electronic products. As a method of improving the integration density of semiconductor devices, a non-volatile memory device having a vertical memory cell structure instead of a planar transistor structure of the related art has been proposed.

In the non-volatile memory device having the vertical memory cell structure, a peripheral circuit region has a planar structure, and a proportion of the peripheral circuit region relative to the entire device is very large. Also, when the number of stacked levels is increased in the vertical memory cell structure, increasing a pump capacity of the peripheral circuit region is required and thus, a large-area capacitor may be required.

SUMMARY

The inventive concept provides a vertical non-volatile memory device in which a capacitor constituting a peripheral circuit region is formed as a vertical type to reduce an area occupied by the capacitor relative to the overall size of the device. Thus, the vertical non-volatile memory device may be highly integrated and have improved reliability.

According to an aspect of the inventive concept, there is provided a non-volatile memory device including: a substrate having a cell region and a peripheral circuit region, a memory cell string including a plurality of vertical memory cells formed in the cell region and channel holes formed to penetrate the vertical memory cells in a first direction vertical to the substrate, an insulating layer formed in the peripheral circuit region on the substrates at substantially the same level as an upper surface of the memory cell string, and a plurality of capacitor electrodes formed on the peripheral circuit region to penetrate at least a portion of the insulating layer in the first direction, the plurality of capacitor electrodes extending parallel to the channel holes. The plurality of capacitor electrodes are spaced apart from one another in a second direction parallel to the substrate, and the insulating layer is interposed between a pair of adjacent capacitor electrodes from among the plurality of capacitor electrodes. Upper surfaces of the plurality of capacitor electrodes may be at substantially the same level as an upper surface of the insulating layer. The plurality of capacitor electrodes may be formed on the substrate to penetrate the insulating layer in the first direction, and lower surfaces of the plurality of capacitor electrodes may be at a lower level than an uppermost surface of the substrate.

The non-volatile memory device may further include a lower insulating layer formed on the substrate in the peripheral circuit region. The plurality of capacitor electrodes may be formed on the lower insulating layer, and lower surfaces of the plurality of capacitor electrodes may be at a higher level than an upper surface of the substrate. The non-volatile memory device may further include a trench oxide layer formed in the substrate. The plurality of capacitor electrodes may be formed on the trench oxide layer. The non-volatile memory device may further include a plurality of dummy gate structures formed on the substrate in the peripheral circuit region. The plurality of capacitor electrodes may be formed on the plurality of dummy gate structures.

Each of the plurality of capacitor electrodes may have a circular pillar shape extending in the first direction. A lower surface of each of the plurality of capacitor electrodes may have substantially the same planar area as each of the channel holes. Each of the plurality of capacitor electrodes may have a pillar shape having an elliptical lower surface. Each of the plurality of capacitor electrodes may have a pillar shape having a polygonal lower surface.

According to another aspect of the inventive concept, there is provided a non-volatile memory device including: a substrate having a cell region and a peripheral circuit region, a memory cell string including a plurality of memory cells stacked in the cell region on the substrate, a lower insulating layer formed in the peripheral circuit region on the substrate, an upper insulating layer formed on the lower insulating layer and having an upper surface disposed at substantially the same level as an upper surface of the memory cell string, and a plurality of vertical capacitors formed in via holes penetrating the upper insulating layer in a vertical direction to the substrate. Each of the plurality of vertical capacitors includes a first capacitor electrode formed along an inner wall of the via hole, a second capacitor electrode surrounded with the first capacitor electrode in the via hole to fill the via hole, and a capacitor insulating layer interposed between the first capacitor electrode and the second capacitor electrode. The plurality of vertical capacitors are formed a sufficiently close distance apart from one another and extend parallel to one another such that charges are accumulated in the upper insulating layer interposed between a pair of adjacent vertical capacitors from among the plurality of vertical capacitors.

Each of the plurality of vertical capacitors may have a cylindrical structure, and the second capacitor electrode may include a lower surface having a concentric circular shape with the same center as the via hole, and has a circular pillar shape extending in a direction vertical to an upper surface of the substrate. The second capacitor electrode may have an elliptical pillar shape, which may have an elliptical lower surface in a direction parallel to the upper surface of the substrate and extend in a direction vertical to the upper surface of the substrate.

Each of the plurality of vertical capacitors may have a square pillar shape, which may have a square lower surface and extend in a direction vertical to the upper surface of the substrate. Each of the plurality of vertical capacitors may have a square pillar shape having a square lower surface. The plurality of vertical capacitors may be arranged apart from one another in a first direction parallel to the upper surface of the substrate and in a second direction parallel to the upper surface of the substrate and perpendicular to the first direction.

A nonvolatile memory device, according to various embodiments, may include a plurality of spaced-apart strings of vertically arranged nonvolatile memory cells on a memory cell region of a substrate. The device may include channel regions vertically extending the plurality of spaced-apart strings. The device may include an electrically insulating layer on a peripheral circuit region of the substrate, which extends adjacent the memory cell region. Moreover, the device may include a plurality of spaced-apart first capacitor electrodes on the peripheral circuit region, said first capacitor electrodes extending vertically and at least partially through said electrically insulating layer in a direction parallel to the channel regions in said plurality of spaced-apart strings of vertically arranged nonvolatile memory cells.

In various embodiments, the device may include a trench insulating layer embedded within the peripheral circuit region of the substrate, and the plurality of spaced-apart first capacitor electrodes may extend through said electrically insulating layer and into a portion of the trench insulating layer extending below the surface of the substrate. Moreover, the trench insulating layer may operate as an additional capacitor dielectric region, which extends between each of the first capacitor electrodes and an underlying portion of the substrate.

According to various embodiments, each of said plurality of spaced-apart capacitor electrodes may be separated from the surface of the substrate by a corresponding electrically conductive gate member, which is separated from the surface of the substrate by a lower electrically insulating layer. In some embodiments, a pitch between the vertically extending channel regions may be equivalent to a pitch between each of the plurality of spaced-apart first capacitor electrodes.

A non-volatile memory device, according to various embodiments, may include a substrate having a cell region and a peripheral circuit region. The device may include a memory cell string including a plurality of vertical memory cells formed in the cell region and channel holes formed to penetrate the vertical memory cells in a first direction vertical to the substrate. The device may include an insulating layer formed in the peripheral circuit region on the substrates at substantially the same level as an upper surface of the memory cell string. The device may include a plurality of capacitor electrodes formed on the peripheral circuit region to penetrate at least a portion of the insulating layer in the first direction, the plurality of capacitor electrodes extending parallel to the channel holes. Moreover, the plurality of capacitor electrodes may be spaced apart from one another in a second direction parallel to the substrate, and the insulating layer may be interposed between a pair of adjacent capacitor electrodes from among the plurality of capacitor electrodes.

In various embodiments, upper surfaces of the plurality of capacitor electrodes may be at substantially the same level as an upper surface of the insulating layer. In some embodiments, the plurality of capacitor electrodes may be formed on the substrate to penetrate the insulating layer in the first direction, and lower surfaces of the plurality of capacitor electrodes may be at a lower level than an uppermost surface of the substrate.

According to various embodiments, the device may include a lower insulating layer formed on the substrate in the peripheral circuit region, where the plurality of capacitor electrodes may be formed on the lower insulating layer, and lower surfaces of the plurality of capacitor electrodes may be at a higher level than an upper surface of the substrate. In some embodiments, the device may include a trench oxide layer formed in the substrate, where the plurality of capacitor electrodes may be formed on the trench oxide layer. Moreover, in some embodiments, the device may include a plurality of dummy gate structures formed on the substrate in the peripheral circuit region, where the plurality of capacitor electrodes may be formed on the plurality of dummy gate structures.

In various embodiments, each of the plurality of capacitor electrodes may have a circular pillar shape extending in the first direction. In some embodiments, a lower surface of each of the plurality of capacitor electrodes may have substantially the same planar area as each of the channel holes. In some embodiments, each of the plurality of capacitor electrodes may have a pillar shape having an elliptical lower surface. Moreover, each of the plurality of capacitor electrodes may have a pillar shape having a polygonal lower surface.

A non-volatile memory device, according to various embodiments, may include a substrate having a cell region and a peripheral circuit region. The device may include a memory cell string including a plurality of memory cells stacked in the cell region on the substrate. The device may include a lower insulating layer formed in the peripheral circuit region on the substrate. The device may include an upper insulating layer formed on the lower insulating layer and having an upper surface disposed at substantially the same level as an upper surface of the memory cell string. Moreover, the device may include a plurality of vertical capacitors formed in via holes penetrating the upper insulating layer in a vertical direction to the substrate, where each of the plurality of vertical capacitors may include: a first capacitor electrode formed along an inner wall of the via hole; a second capacitor electrode surrounded with the first capacitor electrode in the via hole to fill the via hole; and a capacitor insulating layer interposed between the first capacitor electrode and the second capacitor electrode, and where the plurality of vertical capacitors may be formed a sufficiently close distance apart from one another and extend parallel to one another such that charges are accumulated in the upper insulating layer interposed between a pair of adjacent vertical capacitors from among the plurality of vertical capacitors.

In various embodiments, each of the plurality of vertical capacitors may have a cylindrical structure, and the second capacitor electrode may include a lower surface having a concentric circular shape with the same center as the via hole, and may have a circular pillar shape extending in a direction vertical to an upper surface of the substrate. In some embodiments, the second capacitor electrode may have an elliptical pillar shape, which may have an elliptical lower surface in a direction parallel to an upper surface of the substrate and may extend in a direction vertical to an upper surface of the substrate.

According to various embodiments, each of the plurality of vertical capacitors may have a square pillar shape, which may have a square lower surface and extends in a direction vertical to an upper surface of the substrate. In some embodiments, each of the plurality of vertical capacitors may have a square pillar shape having a square lower surface, and the plurality of vertical capacitors may be arranged apart from one another in a first direction parallel to an upper surface of the substrate and in a second direction parallel to the upper surface of the substrate and perpendicular to the first direction.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
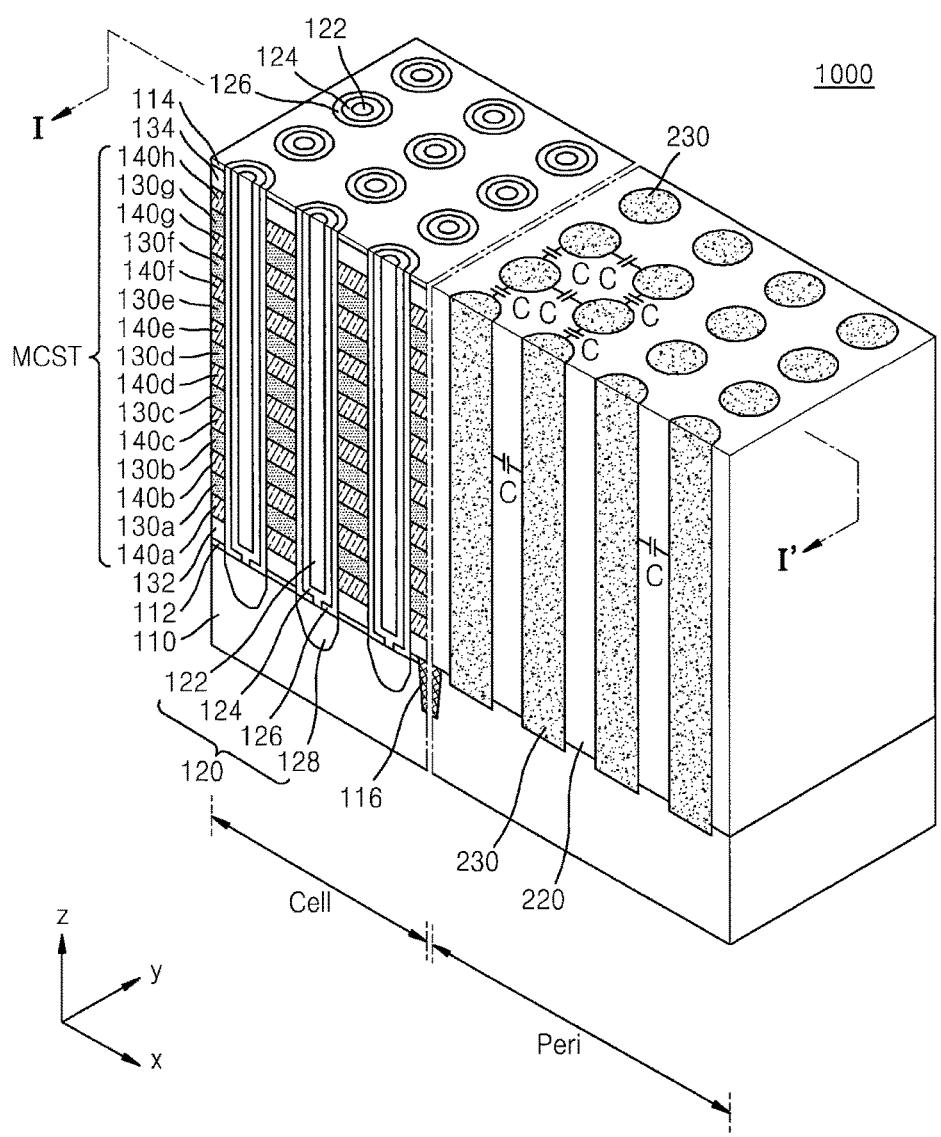
FIG. 1 is a perspective view of a vertical non-volatile memory device according to exemplary embodiments of the inventive concept.

As used herein, expressions such as "at least one of," when preceding a list of elements, modify the entire list of elements and do not modify the individual elements of the list.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one of ordinary skill in the art.

In the drawings, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. Like reference numerals refer to like elements throughout. In the drawings, various elements and regions are exaggerated for clarity. Accordingly, the present inventive concept is not limited by relative sizes or intervals depicted in the figures. Meanwhile, terms may be used herein for ease of description to describe the inventive concept but not intended to limit the scope of the inventive concept.

A non-volatile memory device according to exemplary embodiments of the inventive concept may include a cell array region, a peripheral circuit region, a sense amplifier region, a decoding circuit region, and a connection region. A plurality of memory cells, and bit lines and word lines configured to be electrically connected to the memory cells, are disposed in the cell array region. Circuits configured to drive the memory cells may be disposed in the peripheral circuit region, and circuits configured to read data stored in the memory cells may be disposed in the sense amplifier region. The connection region may be disposed between the cell array region and the decoding circuit region. An interconnection structure configured to electrically connect the word lines with the decoding circuit region may be disposed in the connection region.

FIG. 1 is a schematic perspective view of a three-dimensional (3D) structure of a vertical non-volatile memory device 1000 having a cell region "Cell" and a peripheral circuit region "Peri" according to exemplary embodiments of the inventive concept.

Referring to FIG. 1, the vertical non-volatile memory device 1000 may include a substrate 110 including the cell region Cell and the peripheral region Peri, channel structures 120 disposed on the substrate 110, and memory cell strings MCST disposed along sidewalls of the channel structures 120. The substrate 110 may be divided into the cell region Cell and the peripheral circuit region Peri in a first direction (x direction of FIG. 1) parallel to an upper surface of the substrate 110. A lower insulating layer 112 may be formed on the substrate 110. A device isolation layer 116 may be formed in the substrate 110. The memory cell strings MCST may be arranged in a second direction (y direction of FIG. 1) parallel to the upper surface of the substrate 110 and perpendicular to the first direction. An upper insulating layer 114 may be formed on upper surfaces of the memory cell strings MCST. The channel structures 120 may be formed through the memory cell strings MCST, the upper insulating layer 114, and the lower insulating layer 112 in a third direction (z direction of FIG. 1) vertical to the upper surface of the substrate 110. An insulating layer 220 may be formed on the peripheral circuit region Peri of the substrate 110. The insulating layer 220 may be at substantially the same level as the upper surfaces of the memory cell strings MCST. A plurality of capacitor electrodes 230 may be formed through the insulating layer 220 in the third direction (z direction).

The upper surface of the substrate 110 may extend in the first direction (x direction) and the second direction (y direction). The substrate 110 may include at least one selected from a silicon (Si) substrate, a germanium (Ge) substrate, a silicon-germanium (SiGe) substrate, and a silicon-on-insulator (SOI) substrate. The substrate 110 may include a semiconductor material, for example, a Group III-V compound semiconductor or a Group II-VI oxide semiconductor. In an exemplary embodiment of the inventive concept, a Group IV semiconductor may include silicon, germanium, or silicon-germanium. The substrate 110 may include a bulk wafer or an epitaxial layer.

The substrate 110 may include the cell region Cell and the peripheral circuit region Peri, which may be divided from each other in the first direction (x direction). The device isolation layer 116 may be formed in the substrate 110 between the cell region Cell and the peripheral circuit region Peri. The device isolation layer 116 may extend in the second direction (y direction). The device isolation layer 116 may include at least one selected from insulating materials including a silicon oxide layer and a silicon nitride layer.

The lower insulating layer 112 may be formed on the substrate 110 and extend in the first direction (x direction) and the second direction (y direction) parallel to the upper surface of the substrate 110. The lower insulating layer 112 may include at least one selected from a silicon oxide layer, a silicon nitride layer, or a combination thereof.

Each of the channel structures 120 may have a pillar shape and extend in the third direction (z direction) vertical to a direction of the upper surface of the substrate 110. The channel structures 120 may be spaced apart from one another in the first direction (x direction) and the second direction (y direction). Each of the channel structures 120 may be formed to have, for example, an annular shape. Each of the channel structures 120 is not limited to the annular shape but may have a cylindrical shape or a square pillar shape.

Each of the channel structures 120 may include a buried insulating layer 122, a channel region 124, a gate dielectric layer 126, and a channel contact 128. Lower surfaces of the channel structures 120 may be electrically connected to the substrate 110. For example, as shown in FIG. 1, the channel structures 120 may be connected to the substrate 110 through channel contacts 128 protruding from the lower surfaces of the channel structures 120.

The buried insulating layer 122 may be formed as a circular pillar type within the corresponding one of the channel structures 120. In exemplary embodiments of the inventive concept, the buried insulating layer 122 may include at least one insulating material selected from silicon oxide, silicon nitride, or a combination thereof. In another case, the buried insulating layer 122 may include an air gap.

The channel region 124 may surround an outer sidewall of the buried insulating layer 122 and be formed between the buried insulating layer 122 and the gate dielectric layer 126. The channel region 124 may include a semiconductor material, such as polysilicon (poly-Si) or single crystalline silicon. The semiconductor material may be an undoped semiconductor material or contain p-type or n-type impurities.

The gate dielectric layer 126 may be formed to surround a sidewall of the channel region 124. The gate dielectric layer 126 may extend along the sidewall of the channel region 124 in the third direction (z direction) vertical to the substrate 110. A lower surface of the gate dielectric layer 126 may be in contact with the channel contact 128. In some embodiments, the gate dielectric layer 126 may include a tunnel insulating layer, a charge storage layer, and a blocking insulating layer sequentially stacked.

The lower insulating layer 112, the upper insulating layer 114, a plurality of word lines 130a to 130g, a ground selection line 132, and a string selection line 134 may be formed on the sidewall of each of the channel structures 120 and spaced apart from one another in the third direction (z direction) vertical to the upper surface of the substrate 110. The lower insulating layer 112 may be interposed between the ground selection line 132 and the substrate 110, and the upper insulating layer 114 may be formed on an upper surface of the string selection line 134. Each of the plurality of word lines 130a to 130g, the ground selection line 132, and the string selection line 134 may surround sidewalls of a plurality of channel structures 120 arranged in rows and columns and extend in the first direction (x direction) parallel to the upper surface of the substrate 110. The number of the stacked word lines 130a to 130g is not limited to the number of those illustrated in FIG. 1, and a larger or smaller number of memory cells may be arranged according to the capacity of the vertical non-volatile memory device 1000.

The plurality of word lines 130a to 130g and the channel structure 120 adjacent to the plurality of word lines 130a to 130g may constitute a memory cell transistor. Thicknesses of the plurality of word lines 130a to 130g, the ground selection line 132, and the string selection line 134 and distances therebetween may be the same or different according to required characteristics of a memory cell array.

In an exemplary embodiment, the plurality of word lines 130a to 130g, the ground selection line 132, and the string selection line 134 may include a metal silicide material. For example, the plurality of word lines 130a to 130g, the ground selection line 132, and the string selection line 134 may include at least one selected from titanium silicide (TiSi$_x$), tantalum silicide (TaSi$_x$), tungsten silicide (WSi$_x$), cobalt silicide CoSi$_x$), nickel silicide NiSi$_x$).

Interlayer insulating layers 140a to 140h may be interposed between the ground selection line 132 and the word line 130a formed most adjacent to the substrate 110, between adjacent lines of the plurality of word lines 130a to 140g, and between the word line 130g formed farthest away from the substrate 110 and the string selection line 134. The interlayer insulating layers 140a to 140h may be formed of at least one insulating material selected from silicon oxide, silicon oxynitride, or silicon nitride. The interlayer insulating layers 140a to 140h may electrically insulate the ground selection line 132, the plurality of word lines 130a to 130g, and the string selection line 134 from one another.

The upper insulating layer 114 may be formed on the upper surface of the string selection line 134. The upper insulating layer 114 may extend in the first direction (x direction) and the second direction (y direction) parallel to the upper surface of the string selection line 134. The upper insulating layer 114 may be formed of at least one selected from a silicon oxide layer, a silicon nitride layer, or a combination thereof.

The plurality of word lines 130a to 130g, the ground selection line 132, the string selection line 134, and the interlayer insulating layers 140a to 140h may form each of the memory cell strings MCST.

The insulating layer 220 formed on the substrate 110 may extend in the third direction (z direction) vertical to the upper surface of the substrate 110. An upper surface of the insulating layer 220 may be at substantially the same level as the upper surfaces of the memory cell strings MCST. The plurality of capacitor electrodes 230 may be formed through the insulating layer 220 in the third direction (z direction). The plurality of capacitor electrodes 230 may have substantially the same circular pillar shape as the channel structures 120. In an exemplary embodiment of the inventive concept, the insulating layer 220 may be formed of at least one insulating material selected from a silicon oxide layer, a silicon nitride layer, or a combination thereof.

In an exemplary embodiment, the insulating layer 220 may be formed of a metal oxide having a high dielectric constant. For example, the insulating layer 220 may include at least one of metal oxides including zirconium oxide (ZrO$_2$), aluminum oxide (Al$_2$O$_3$), tantalum oxide (Ta$_2$O$_3$), and hafnium oxide (HfO$_2$). Although FIG. 1 illustrates an example in which the insulating layer 220 is a single layer, the inventive concept is not limited thereto, and the insulating layer 220 may be a compound insulating layer obtained by stacking at least two interlayer insulating layers.

The plurality of capacitor electrodes 230 may be formed through the insulating layer 220 in the third direction (z direction) vertical to the upper surface of the substrate 110. The plurality of capacitor electrodes 230 may have substantially the same circular pillar shape as the channel structures 120. The plurality of capacitor electrodes 230 may extend in the third direction (z direction) parallel to the channel structures 120. The plurality of capacitor electrodes 230 may be spaced apart from one another in the first direction (x direction) and the second direction (y direction) parallel to the upper surface of the substrate 110. The plurality of capacitor electrodes 230 may have substantially the same annular shape as the channel structures 120.

The plurality of capacitor electrodes 230 may be formed of a metal material, a silicon material, or a combination thereof. Metal materials may include tungsten (W), tungsten nitride (WN), titanium (Ti), titanium nitride (TiN), tantalum (Ta), tantalum nitride (TaN), platinum (Pt), cobalt (Co), and aluminum (Al). Silicide materials may include poly-Si, tungsten silicide (WSi), cobalt silicide CoSi), and nickel silicide (NiSi).

The insulating layer 220 may be interposed between a pair of adjacent capacitor electrodes 230 from among the plurality of capacitor electrodes 230. Charges may be accumulated in the insulating layer 220 between the pair of adjacent capacitor electrodes 230 to generate capacitance (refer to C in FIG. 1).

The plurality of capacitor electrodes 230 may be formed to have different heights and thicknesses according to a capacitance required by the vertical non-volatile memory device 1000. Also, the insulating layer 220 interposed between the pair of adjacent capacitor electrodes 230 may vary. A capacitance generated according to the quantity of charges accumulated in a pair of adjacent capacitor electrodes 230 from among the plurality of capacitor electrodes 230 may depend on the height and thickness of each of the plurality of capacitor electrodes 230 and the insulating layer 220 interposed between the pair of capacitor electrodes 230. Specifically, the capacitance may increase as the height of each of the plurality of capacitor electrodes 230 increases, the thickness of each of the plurality of capacitor electrodes 230 increases, and the thickness of the insulating layer 220 interposed between the pair of adjacent capacitor electrodes 230 decreases.

In some embodiments, a gate structure may be formed on the substrate 110. The gate structure may include a low-power gate structure and a high-power gate structure. The gate structure may include a control gate, a gate insulating layer interposed between the control gate and the substrate 110, and spacers covering side surfaces of the control gate. Impurities may be implanted into both sides of the substrate 110 on which the gate structure is formed, thereby forming a source region and a drain region. Vertical electrodes may be formed on the source region and the drain region.

In the non-volatile memory device according to the inventive concept, each of the plurality of capacitor electrodes 230 may be formed in a vertical circular pillar shape instead of a planar shape. Thus, an area occupied by a capacitor in a peripheral circuit region Peri may be reduced so that a proportion of the peripheral circuit region Peri relative to the entire non-volatile memory device can be reduced, and the non-volatile memory device can be downscaled and highly integrated. Also, each of the plurality of capacitor electrodes 230 may have a vertical structure so that a larger number of capacitor electrodes 230 can be disposed in the same area as compared with a planar type. As a result, owing to a high capacitance, the non-volatile memory device may effectively adjust to an increase in pump capacity due to an increase in the number of stacked memory cells.

Figure 2:
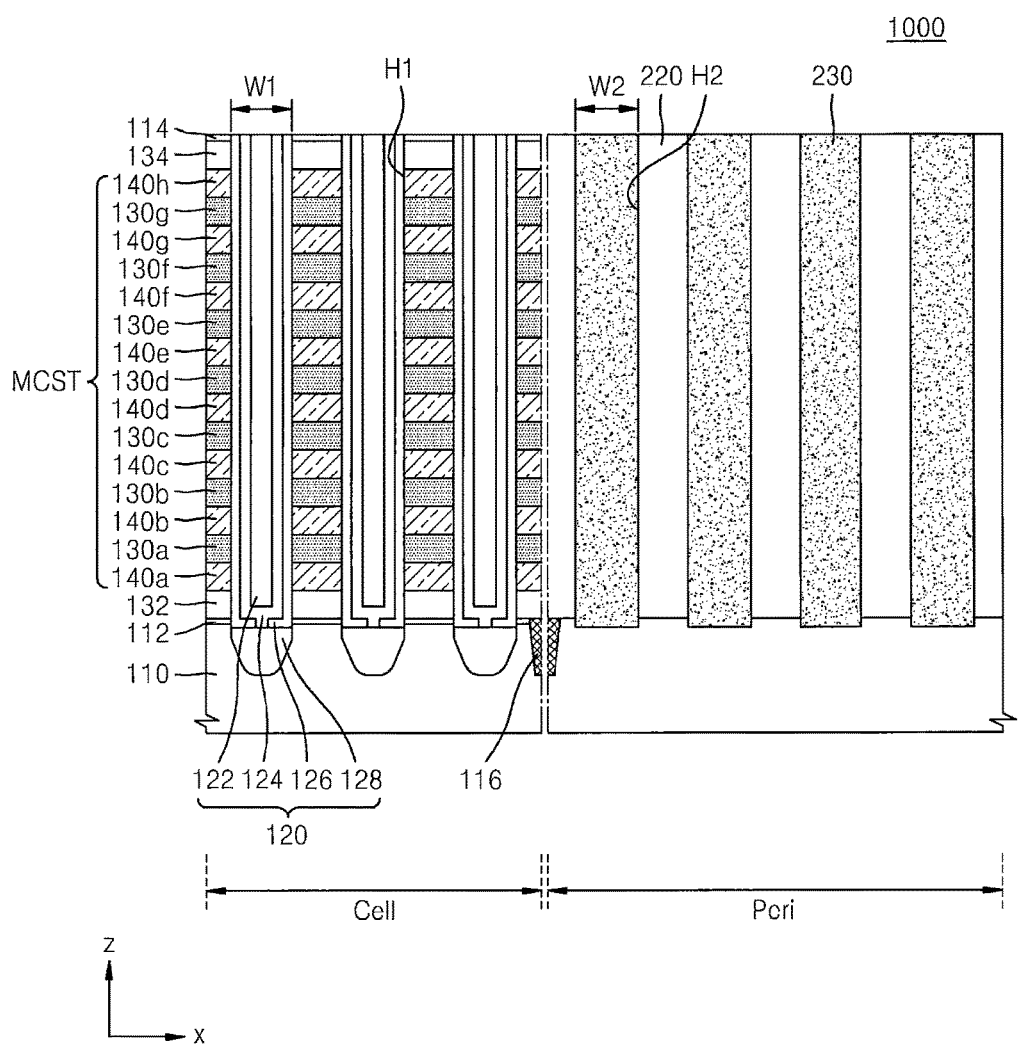
FIGS. 2 through 6 are cross-sectional views of a vertical non-volatile memory device according to exemplary embodiments of the inventive concept.

FIG. 2 is a cross-sectional view of the vertical non-volatile memory device 1000 shown in FIG. 1, which is taken along line a line IT of FIG. 1. Referring to FIG. 2, a section width W2 of the plurality of capacitor electrodes 230 obtained in the first direction (x direction) parallel to the upper surface of the substrate 110 may be substantially equal to a section width W1 of the channel structures 120 obtained in the first direction (x direction). Also, a length of the plurality of capacitor electrodes 230 obtained in the third direction (z direction) parallel to the upper surface of the substrate 110 may be substantially equal to a length of the channel structures 120 obtained in the third direction (z direction).

The plurality of capacitor electrodes 230 may be formed by depositing a metal material or a silicon material within capacitor electrode via holes H2. The capacitor electrode via holes H2 may be formed by etching only the insulating layer 220 using a dry etching process or a wet etching process. A process of forming the capacitor electrode via holes H2 may be performed at the same time as a process of forming channel holes H1 in which the channel structures 120 are formed. By performing a process of etching the channel holes H1 and a process of etching the capacitor electrode via holes H2 at the same time, as described above, the plurality of capacitor electrodes 230 may be formed to have substantially the same section width and height as the channel structures 120. As shown in FIG. 1, the plurality of capacitor electrodes 230 may have substantially the same circular pillar shape as the channel structures 120.

During the process of etching the capacitor electrode via holes 112, the insulating layer 220 may be etched, and an upper portion of the substrate 110 may be etched. Thus, the plurality of capacitor electrodes 230 may penetrate the insulating layer 220, and lower surfaces of the plurality of capacitor electrodes 230 may be formed at a lower level than an uppermost surface of the substrate 110.

The formation of the plurality of capacitor electrodes 230 may include forming the capacitor electrode via holes H2 and depositing at least one of a metal material or a silicide material. Metal materials may include tungsten (W), tungsten nitride (WN), titanium (Ti), titanium nitride (TiN), tantalum (Ta), tantalum nitride (TaN), platinum (Pt), cobalt (Co), and aluminum (Al). Silicide materials may include poly-Si, tungsten silicide (WSi), cobalt silicide (CoSi), and nickel silicide (NiSi). The plurality of capacitor electrodes 230 may be formed by depositing the above-described metal material or silicide material using at least one selected from a chemical vapor deposition (CVD) process, a plasma-enhanced CVD (PECVD) process, and a physical vapor deposition (PVD) process.

Figure 3:
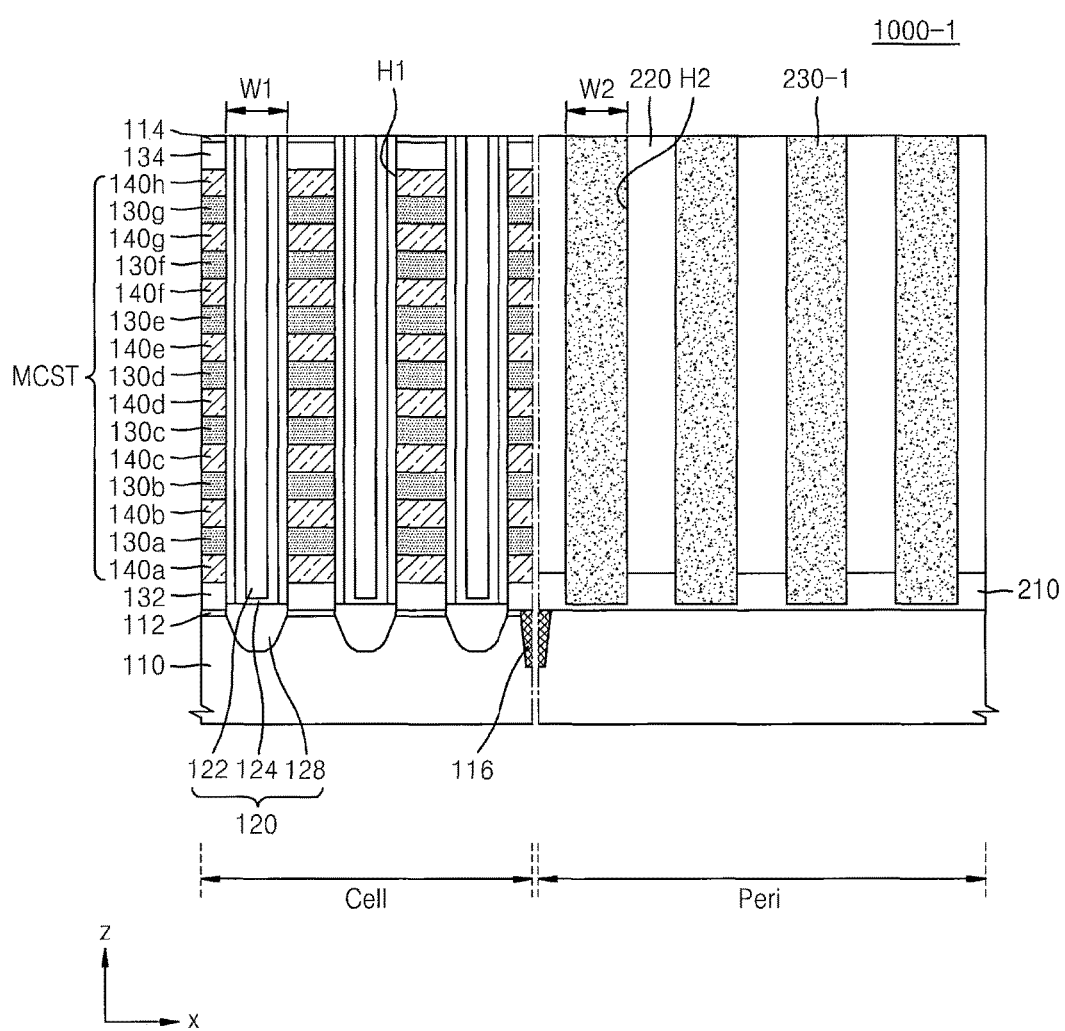

FIG. 3 is a cross-sectional view of a vertical non-volatile memory device 1000-1 according to exemplary embodiments of the inventive concept. The vertical non-volatile memory device 1000-1 includes the same components as the vertical non-volatile memory device 1000 shown in FIG. 2 except that the vertical non-volatile memory device 1000-1 of FIG. 3 further includes a lower insulating layer 210 and lower surfaces of a plurality of capacitor electrodes 230 are formed in the lower insulating layer 210. Hereinafter, descriptions of the same components as described with reference to FIG. 2 will be omitted.

Referring to FIG. 3, the vertical non-volatile memory device 1000-1 may further include the lower insulating layer 210 formed on a substrate 110 in a peripheral circuit region Peri. An insulating layer 220 may be formed on the lower insulating layer 210. The lower insulating layer 210 may include any one of a silicon oxide layer, a silicon nitride layer, or a combination thereof. The lower insulating layer 210 may be formed of the same material as the insulating layer 220, but the inventive concept is not limited thereto, and the lower insulating layer 210 may be formed of a different material.

A plurality of capacitor electrodes 230-1 may be formed in the lower insulating layer 210 to penetrate the insulating layer 220 in a third direction (z direction) vertical to an upper surface of the substrate 110. Lower surfaces of the plurality of capacitor electrodes 230-1 may be formed at a higher level than the upper surface of the substrate 110 and at a lower level than an upper surface of the lower insulating layer 210. As described with reference to FIG. 2, a process of etching capacitor electrode via holes H2 for forming the plurality of capacitor electrodes 230-1 may be performed at the same time as a process of etching channel holes H1 for forming channel structures 120. Thus, a lower surface of a gate dielectric layer 126 of the channel structure 120 may be formed at substantially the same level as lower surfaces of the plurality of capacitor electrodes 230-1.

Figure 4:
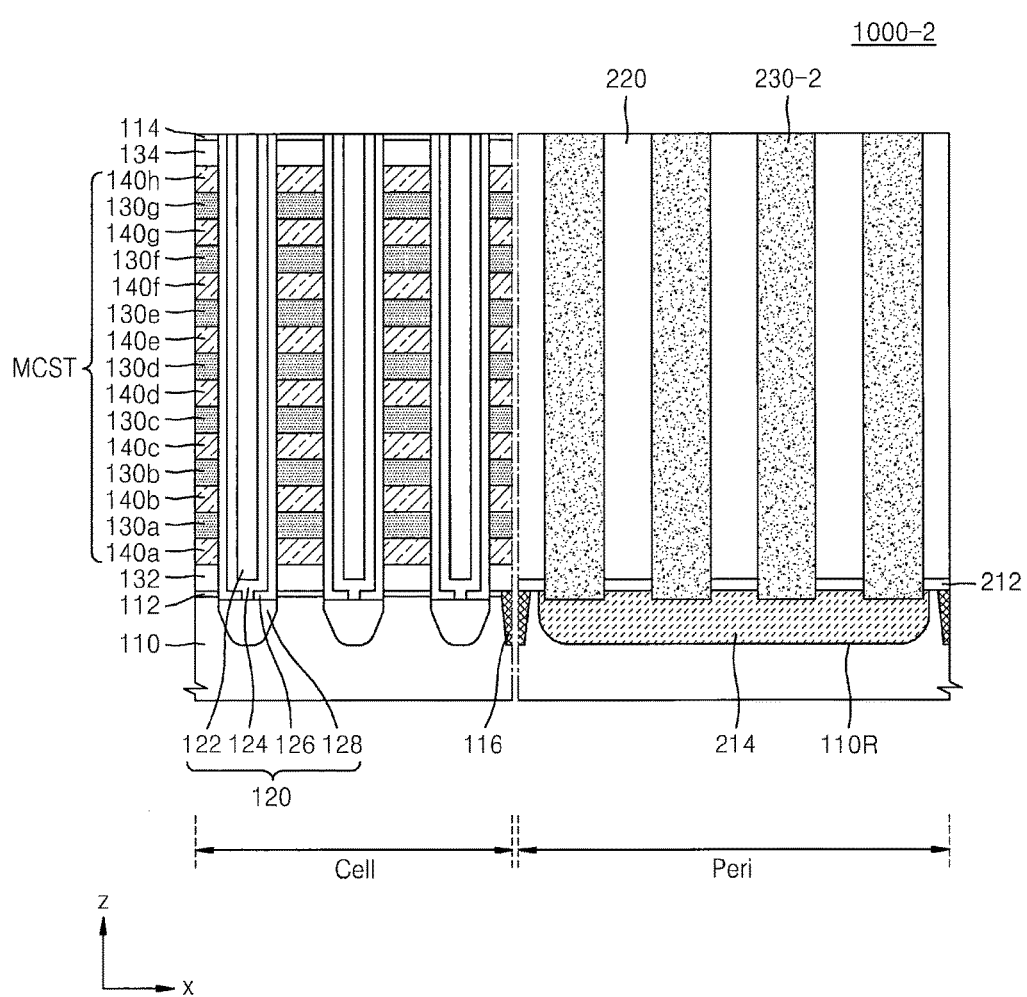

FIG. 4 is a cross-sectional view of a vertical non-volatile memory device 1000-2 according to exemplary embodiments of the inventive concept. The vertical non-volatile memory device 1000-2 includes the same components as the vertical non-volatile memory device 1000 shown in FIG. 2 except that a trench insulating layer 214 is formed in a substrate 110, a lower insulating layer 212 is formed on the substrate 110, and a plurality of capacitor electrodes 230-2 are formed on the trench insulating layer 214 through the lower insulating layer 212. Hereinafter, descriptions of the same components as described with reference to FIG. 2 will be omitted.

Referring to FIG. 4, a recess region 110R may be formed in the substrate 110, and the trench insulating layer 214 may be formed and extend from an upper surface of the substrate 110 to the recess region 110R in a first direction (x direction) and a second direction (refer to y direction in FIG. 1) parallel to the upper surface of the substrate 110. The trench insulating layer 214 may be formed by filling a silicon oxide layer or a silicon nitride layer in the recess region 110R. In an exemplary embodiment of the inventive concept, the substrate 110 may be a silicon substrate, and the trench insulating layer 214 may include a silicon oxide layer.

The plurality of capacitor electrodes 230-2 may be formed through the lower insulating layer 212 and the insulating layer 220 and partially surrounded by the trench insulating layer 214. Lower surfaces of the plurality of capacitor electrodes 230-2 may be formed at a lower level than a lower surface of the lower insulating layer 212.

In the vertical non-volatile memory device 1000-2 according to the exemplary embodiment of the inventive concept, the plurality of capacitor electrodes 230-2 may be partially surrounded with the trench insulating layer 214. Thus, occurrence of a parasitic capacitance may be prevented as compared with a case (refer to FIGS. 1 and 2) in which the plurality of capacitor electrodes 230-2 are formed directly on the substrate 110 formed of silicon.

Figure 5:
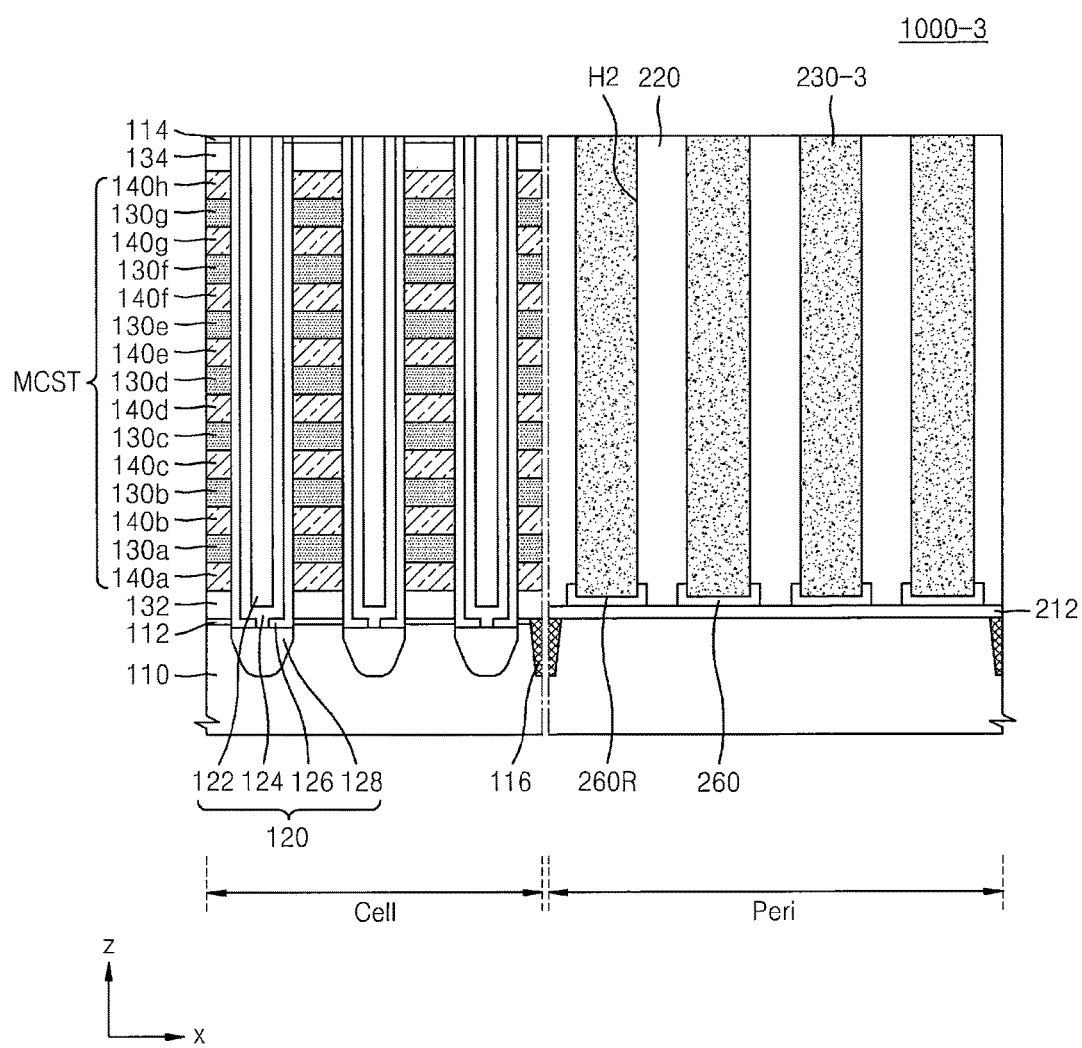

FIG. 5 is a cross-sectional view of a vertical non-volatile memory device 1000-3 according to exemplary embodiments of the inventive concept. The vertical non-volatile memory device 1000-3 includes the same components as the vertical non-volatile memory device 1000 shown in FIG. 2 except that a plurality of capacitor electrodes 230-3 are formed on gate members 260. Hereinafter, descriptions of the same components as described with reference to FIG. 2 will be omitted.

The gate members 260 may be formed on a lower insulating layer 212 formed on a substrate 110. The gate members 260 may be formed of a conductive material, such as a metal material or a metal silicide material. The gate members 260 may be formed before a process of forming channel structures 120 in a cell region Cell.

The plurality of capacitor electrodes 230-3 may be formed on the gate members 260. Lower surfaces of the plurality of capacitor electrodes 230-3 may be formed in recess regions 260R disposed on upper surfaces of the gate members 260. Since the plurality of capacitor electrodes 230-3 may be formed in the recess regions 260R, the lower surfaces of the plurality of capacitor electrodes 230-3 may be formed at a lower level than uppermost surfaces of the gate members 260.

During the formation of via holes H2, an insulating layer 220 may be etched using an etchant having an etch selectivity with respect to a conductive material. In this case, the gate members 260 may be used as etch stoppers. When the insulating layer 220 is etched using the etchant having the etch selectivity, portions of the upper surfaces of the gate members 260 may be partially etched to a predetermined depth due to over-etching. In this case, the recess regions 260R may be formed.

The plurality of capacitor electrodes 230-3 may be formed by filling the via holes H2 with a conductive material. Since a method and material for forming the plurality of capacitor electrodes 230-3 are the same as a method and material for forming the capacitors 230 described with reference to FIG. 2, descriptions thereof are omitted here.

Figure 6:
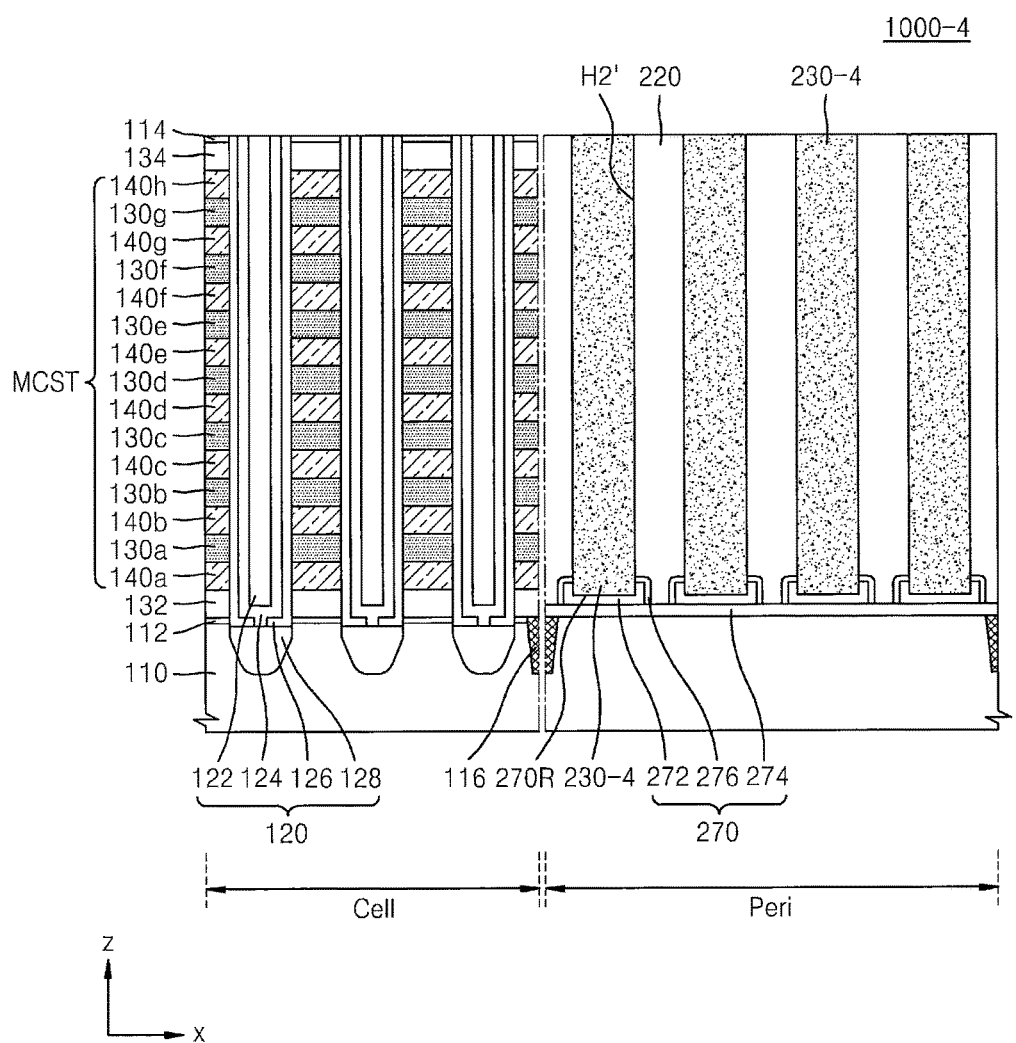

FIG. 6 is a cross-sectional view of a vertical non-volatile memory device 1000-4 according to exemplary embodiments of the inventive concept. The vertical non-volatile memory device 1000-4 includes the same components as the vertical non-volatile memory device 1000 shown in FIG. 2 except that a dummy gate structure 270 is formed, and a plurality of capacitor electrodes 230-4 are formed on the dummy gate structure 270. Hereinafter, descriptions of the same components as described with reference to FIG. 2 will be omitted.

The dummy gate structure 270 may include a dummy control gate 272, a dummy gate insulating layer 274 interposed between the dummy control gate 272 and a substrate 110, and spacers 276 covering an upper surface and side surfaces of the dummy control gate 272. A small quantity of charges may be accumulated in the dummy gate insulating layer 274 interposed between the dummy control gate 272 and the substrate 110 to generate capacitance. The dummy control gate 272 may be formed of a conductive material, such as a metal material or a metal silicide material. The dummy gate structure 270 cannot function as a transistor unlike a typical gate structure, but may function as an etch stop layer during an etching process of forming the plurality of capacitor electrodes 230-4.

The plurality of capacitor electrodes 230-4 may be formed on the dummy gate structure 270. Lower surfaces of the plurality of capacitor electrodes 230-4 may be formed in recess regions 270R formed in upper surfaces of dummy control gates 272. Since the plurality of capacitor electrodes 230-4 are formed in the recess regions 270R, the lower surfaces of the plurality of capacitor electrodes 230-4 may be formed at a lower level than an uppermost surface of the dummy gate structure 270.

In an exemplary embodiment, the dummy control gate 272 in which the recess region 270R is formed may be formed of a conductive material. Thus, similar to the via hole H2 described with reference to FIG. 5, the dummy control gate 272 may be used as an etch stop layer during the formation of the via hole H2'. Also, as described with reference to FIG. 6, when an insulating layer 220 is etched using an etchant having an etch selectivity with respect to a conductive material, portions of the upper surfaces of the dummy control gates 272 may be partially etched to a predetermined depth due to over-etching. In this case, the recess regions 270R may be formed.

The plurality of capacitor electrodes 230-4 may be formed by filling the via holes H2 with a conductive material. Since a method and material for forming the plurality of capacitor electrodes 230-4 are the same as a method and material for forming the capacitors 230 described with reference to FIG. 2, descriptions thereof are omitted here.

Figure 7:
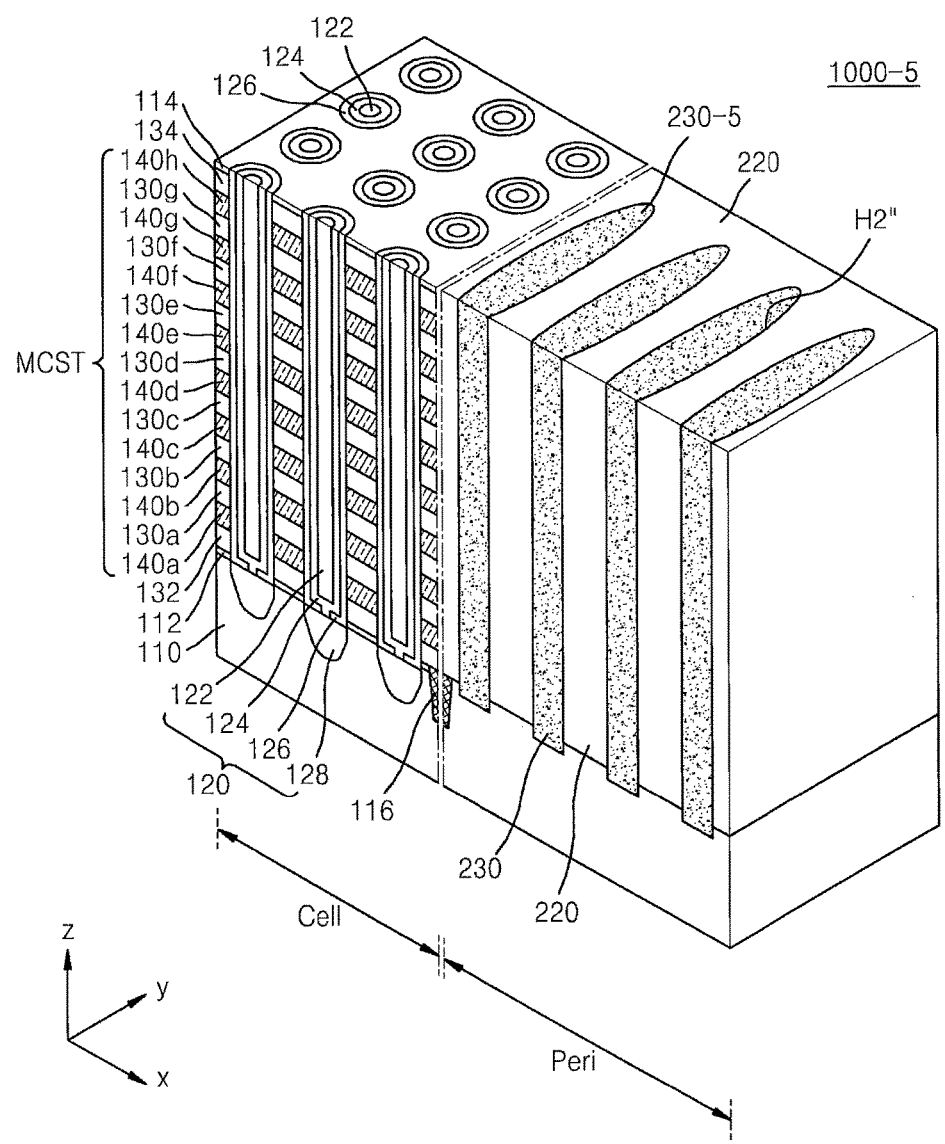
FIGS. 7 through 9 are perspective views of a vertical non-volatile memory device according to exemplary embodiments of the inventive concept.

FIG. 7 is a perspective view of a vertical non-volatile memory device 1000-5 according to exemplary embodiments of the inventive concept. The vertical non-volatile memory device 1000-5 includes the same components as the vertical non-volatile memory device 1000 shown in FIG. 1 except that a plurality of capacitor electrodes 230-5 do not have a circular pillar shape but a pillar shape having an elliptical lower surface. Hereinafter, descriptions of the same components as described with reference to FIG. 1 will be omitted.

The plurality of capacitor electrodes 230-5 may be formed on a substrate 110 to penetrate an insulating layer 220. Lower surfaces of the plurality of capacitor electrodes 230-5 may be formed at a lower level than an uppermost surface of the substrate 110. This is because when the insulating layer 220 is etched using an etchant having an etch selectivity with respect to the substrate 110 during an etching process for forming via holes H2", a portion of the uppermost surface of the substrate 110 may be etched.

The plurality of capacitor electrodes 230-5 may be arranged apart from one another in a first direction (x direction) parallel to an upper surface of the substrate 110, and may extend in a second direction (y direction) parallel to the upper surface of the substrate 110 and perpendicular to the first direction (x direction) and in a third direction (z direction) vertical to the upper surface of the substrate 110. Charges may be accumulated in an insulating layer 220 interposed between a pair of adjacent capacitor electrodes 230-5 from among the plurality of capacitor electrodes 230-5 to generate capacitance. The capacitance may increase as the height of the plurality of capacitor electrodes 230-5 increases, the planar area of the plurality of capacitor electrodes 230-5 increases, and the thickness of the insulating layer 220 interposed between the pair of capacitor electrodes 230-5 decreases.

Figure 8:
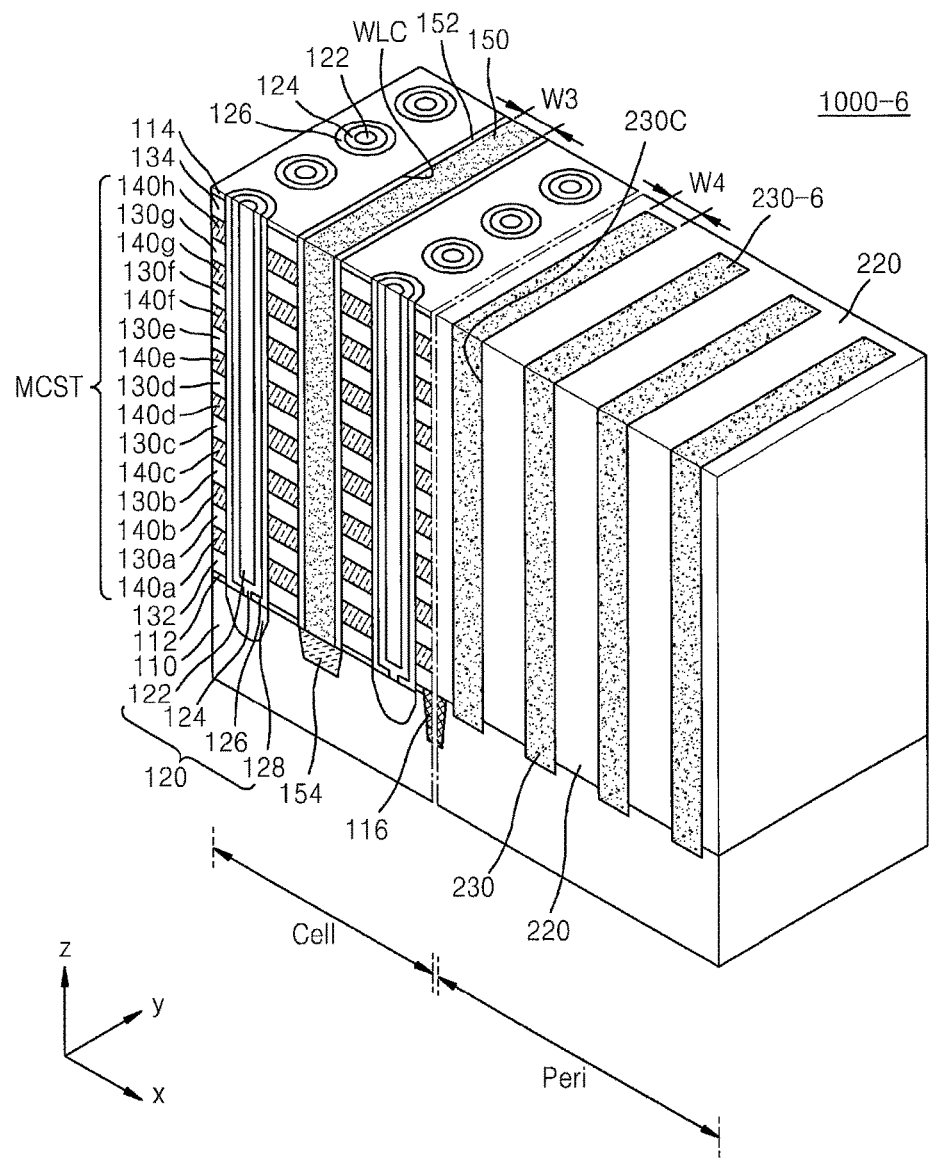

FIG. 8 is a perspective view of a vertical non-volatile memory device 1000-6 according to exemplary embodiments of the inventive concept. The vertical non-volatile memory device 1000-6 includes the same components as the vertical non-volatile memory device 1000 shown in FIG. 1 except that the vertical non-volatile memory device 1000-6 further includes a common source line 150 formed in a cell region Cell and common source line spacers 152 formed on both sidewalls of the common source line 150. Also, a plurality of capacitor electrodes 230-6 may have a line shape similar to the common source line 150. Hereinafter, descriptions of the same components as described with reference to FIG. 1 will be omitted.

The common source line 150 may penetrate a memory cell string MCST in a third direction (z direction) vertical to an upper surface of a substrate 110, and extend in a second direction (y direction) parallel to the upper surface of the substrate 110. In an exemplary embodiment of the inventive concept, the common source line 150 may be formed of a conductive material, for example, a metal such as tungsten (W), aluminum (Al), copper (Cu), titanium (Ti), or tantalum (Ta), and a metal silicide such as doped poly-Si, nickel silicide ($NiSi_x$), titanium silicide ($TiSi_x$), tungsten silicide ($WSi_x$), or cobalt silicide ($CoSi_x$). The common source line spacers 152 may be formed using an insulating material on both sidewalls of the common source line 150.

The plurality of capacitor electrodes 230-6 may be formed on the substrate 110 to penetrate an insulating layer 220 in the third direction (z direction) vertical to the upper surface of the substrate 110. The plurality of capacitor electrodes 230-6 may extend in the second direction (y direction) parallel to the upper surface of the substrate 110 to be parallel to the common source line 150. The formation of the plurality of capacitor electrodes 230-6 may include forming capacitor line cuts 230C using the same etching process as a process of etching a word line cut WLC for forming the common source line 150. The plurality of capacitor electrodes 230-6 may be formed by depositing at least one of metal materials including tungsten (W), tungsten nitride (WN), titanium (Ti), titanium nitride (TiN), tantalum (Ta), tantalum nitride (TaN), platinum (Pt), cobalt (Co), and aluminum (Al) or silicide materials including poly-Si, tungsten silicide (WSi), cobalt silicide (CoSi) and nickel silicide (NiSi) in spaces formed by the capacitor line cuts 230C. The plurality of capacitor electrodes 230-6 may be formed by depositing the above-described metal materials or silicide materials using at least one selected from a CVD process, a PECVD process, and a PVD process. A section width W4 of the plurality of capacitor electrodes 230-6 may be substantially equal to a section width W3 of the common source line 150.

Charges may be accumulated in the insulating layer 220 interposed between a pair of adjacent capacitor electrodes 230-6 from among the plurality of capacitor electrodes 230-6 to generate capacitance. The capacitance may increase as the height of the plurality of capacitor electrodes 230-6 increases, the planar area of the plurality of capacitor electrodes 230-6 increases, and the thickness of the insulating layer 220 interposed between the pair of capacitor electrodes 230-6 decreases.

Figure 9:
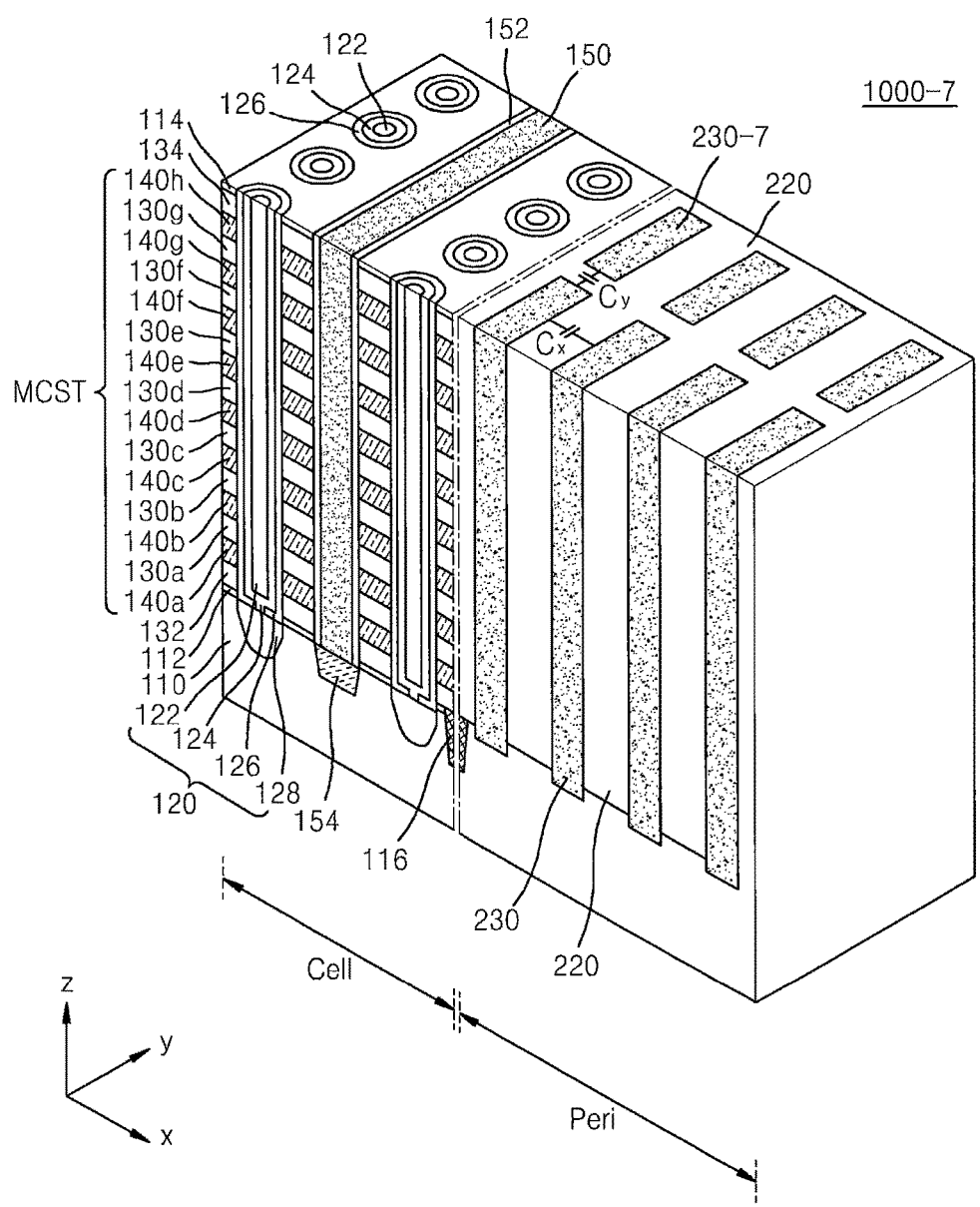

FIG. 9 is a perspective view of a vertical non-volatile memory device 1000-7 according to exemplary embodiments of the inventive concept. Although the vertical non-volatile memory device 1000-7 includes the same components as the vertical non-volatile memory device 1000-6 shown in FIG. 8, the vertical non-volatile memory device 1000-7 differs from the vertical non-volatile memory device 1000-6 in that a plurality of capacitor electrodes 230-7 are spaced apart from one another not only in a first direction (x direction) parallel to an upper surface of a substrate 110 but also in a second direction (y direction) perpendicular to the first direction (x direction) and parallel to the upper surface of the substrate 110. Hereinafter, descriptions of the same components as described with reference to FIG. 8 will be omitted.

The plurality of capacitor electrodes 230-7 may penetrate an insulating layer 220 in a third direction (z direction) vertical to the upper surface of the substrate 110. Also, the plurality of capacitor electrodes 230-7 may be arranged apart from one another in the first direction (x direction) parallel to a common source line 150, and may extend in the second direction (y direction). As described above, the plurality of capacitor electrodes 230-7 may be arranged apart from one another in the first direction (x direction) and the second direction (y direction). As compared with the plurality of capacitor electrodes 230-6 of the vertical non-volatile memory device 1000-6 shown in FIG. 8, the plurality of capacitor electrodes 230-7 may be spaced apart from one another not only in the first direction (x direction) but also in the second direction (y direction). Thus, a capacitance $C_x$ may be generated by accumulating charges in the insulating layer 220 interposed between a pair of capacitor electrodes 230-7 adjacently disposed in the first direction (x direction), and a capacitance $C_y$ may be generated by accumulating charges in the insulating layer 220 interposed between a pair of capacitor electrodes 230-7 adjacently disposed in the second direction (y direction). The capacitances $C_x$ and $C_y$ may increase not only with a reduction in the thickness of the insulating layer 220 interposed between the pair of capacitor electrodes 230-7 adjacently disposed in the first direction (x direction) but also with a reduction in the thickness of the insulating layer 220 interposed between the pair of capacitor electrodes 230-7 adjacently disposed in the second direction (y direction).

Figure 10:
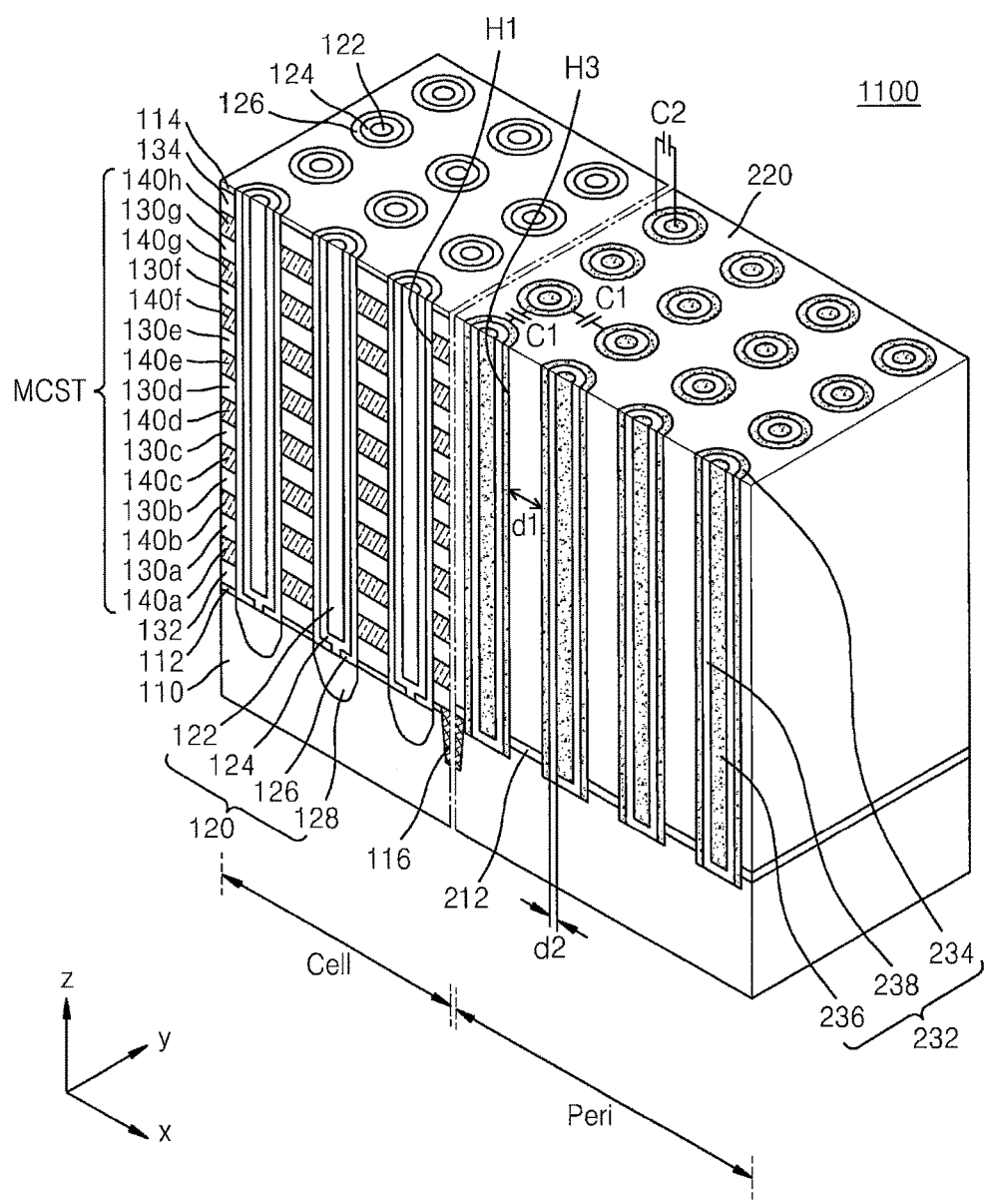
FIGS. 10 through 13 are perspective views of a vertical non-volatile memory device according to exemplary embodiments of the inventive concept.

FIG. 10 is a schematic perspective view of a 3D structure of a vertical non-volatile memory device 1100 including a cell region and a peripheral circuit region according to exemplary embodiments of the inventive concept. Referring to FIG. 10, the vertical non-volatile memory device 1100 may include a substrate 110 including a cell region Cell and a peripheral circuit region Peri, channel structures 120 arranged on the substrate 110, and memory cell strings MCST disposed along sidewalls of the channel structures 120. The substrate 110 may be divided in to the cell region Cell and the peripheral circuit region Peri along a first direction (refer to x direction in FIG. 1) parallel to an upper surface of the substrate 110. A device isolation layer 116 may be formed in the substrate 110 to separate the cell region Cell from the peripheral circuit region Peri. The memory cell strings MCST may be arranged in a second direction (refer to y direction in FIG. 1) parallel to the upper surface of the substrate 110 and perpendicular to the first direction. The channel structures 120 may be formed to penetrate the memory cell strings MCST in a third direction (refer to z direction in FIG. 1) vertical to the upper surface of the substrate 110. A lower insulating layer 212 may be formed on the peripheral circuit region Peri of the substrate 110, and an insulating layer 220 may be formed on the lower insulating layer 212. An upper surface of the insulating layer 220 may be at substantially the same level as upper surfaces of the memory cell strings MCST. A plurality of vertical capacitors 220 may be formed to penetrate the lower insulating layer 212 and the insulating layer 220 in the third direction (z direction). The plurality of vertical capacitors 232 may have substantially the same circular pillar shape as the channel structures 120. The substrate 110, the device isolation layer 116, the memory cell strings M, the channel structures 120, and the insulating layer 220 are the same as described with reference to FIG. 1 and thus, repeated descriptions thereof are omitted here.

As described above, the plurality of vertical capacitors 232 may be formed on the substrate 110 to penetrate the lower insulating layer 212 and the insulating layer 220. Also, the plurality of vertical capacitors 232 may be arranged a first distance d1 apart from one another in a first direction (x direction) parallel to an upper surface of the substrate 110. The plurality of vertical capacitors 232 may be arranged parallel to the channel structures 120. The plurality of vertical capacitors 232 may have substantially the same shape as the channel structures 120, namely, a circular pillar shape having a circular lower surface.

Each of the plurality of vertical capacitors 232 may include a first capacitor electrode 234, a second capacitor electrode 236, and a capacitor insulating layer 238. The plurality of vertical capacitors 232 may be formed to fill via holes H3 formed by etching the insulating layer 220 in a third direction (z direction) vertical to the upper surface of the substrate 110. The via holes H3 may have substantially the same shape as channel holes H1 in which the channel structures 120 are formed. The via holes H3 may be formed using the same etching process as the channel holes H1 at the same time.

The first capacitor electrode 234 may be formed to a predetermined thickness along an inner wall of the corresponding one of the via holes H3. In an exemplary embodiment, the first capacitor electrode 234 may include at least one of metal materials including tungsten (W), tungsten nitride (WN), titanium (Ti), titanium nitride (TiN), tantalum (Ta), tantalum nitride (TaN), platinum (Pt), cobalt (Co), and aluminum (Al) or silicide materials including poly-Si, tungsten silicide (WSi), cobalt silicide (CoSi), and nickel silicide (NiSi) in spaces formed by the capacitor line cuts 230C. The first capacitor electrode 234 may be formed by depositing the above-described metal materials or silicide materials using at least one selected from a CVD process, a PECVD process, and a PVD process. The first capacitor electrode 234 may be formed to a predetermined thickness using any one of the above-described deposition methods so that not the whole via hole H3 but only a portion of the inner wall of the via hole H3 may be filled with any one of the metal materials or the silicide materials.

The second capacitor electrode 236 may have a circular pillar shape, which may be surrounded with the first capacitor electrode 234, have a concentric lower surface with the same center as the via hole H3, and extend in the third direction (z direction) to the upper surface of the substrate 110. Like the first capacitor electrode 234, the second capacitor electrode 236 may be formed of at least one of metal materials or silicide materials. The second capacitor electrode 236 may be formed of the same material as the first capacitor electrode 234, but the inventive concept is not limited thereto and the first and second capacitor electrodes 234 and 236 may be formed of different materials. The second capacitor electrode 236 may be formed by depositing any one of the metal materials or silicide materials using a CVD process, a PECVD process, or a PVD process after a process of forming the capacitor insulating layer 238.

The capacitor insulating layer 239 may be formed to surround a surface of the first capacitor electrode 234 and be surrounded by the second capacitor electrode 236. The capacitor insulating layer 238 may be, for example, a single layer or a combination of at least one selected from a silicon oxide layer ($SiO_2$), an aluminum oxide layer ($Al_2O_3$), a hafnium oxide layer ($HfO_2$), a lanthanum oxide layer ($La_2O_3$), a hafnium aluminum oxide layer ($HfAl_xO_y$), a hafnium silicon oxide layer ($HfSi_xO_y$), a zirconium oxide layer ($ZrO_2$), a zirconium silicon oxide layer ($ZrSi_xO_y$), a tantalum oxide layer ($Ta_2O_3$), a titanium oxide layer ($TiO_2$), lead zirconate titanate (PZT), a lead titanium oxide layer ($PbTiO_3$), a lead zirconium oxide layer ($PbZrO_3$), a lead oxide layer (PbO), a strontium titanium oxide layer ($SrTiO_3$), a barium titanium oxide layer ($BaTiO_3$), a vanadium oxide layer ($V_2O_5$), (Ba, Sr)$TiO_3$ (BST), and SBT ($SrBi_2Ta_2O_9$) (SBT) or a combination thereof. The capacitor insulating layer 238 may be interposed between the first capacitor electrode 234 and the second capacitor electrode 236 and formed of a metal oxide having a higher dielectric constant than a silicon oxide layer so that a larger quantity of charges can be accumulated to generate higher capacitance. The capacitor insulating layer 238 may be formed using at least one selected from a CVD process, a PECVD process, and an atomic layer deposition (ALD) process.

In an exemplary embodiment of the inventive concept, each of the plurality of vertical capacitors 232 may have a metal-insulator-metal (MIM) core-shell structure. Charges may be accumulated in the insulating layer 220 interposed between a pair of adjacent vertical capacitors 232 from among the plurality of vertical capacitors 232 to generate a first capacitance C1. Also, charges may be accumulated in the capacitor insulating layer 238 interposed between the first and second capacitor electrodes 234 and 236 of each of the plurality of vertical capacitors 232 to generate a second capacitance C2. The first capacitance C1 may increase as a distance d1 between the pair of adjacent vertical capacitors 232 having the insulating layer 220 interposed therebetween decreases. Similarly, the second capacitance C2 may increase as a distance d2 between the first and second capacitor electrodes 234 and 236 having the capacitor insulating layer 238 interposed therebetween decreases.

The vertical non-volatile memory device 1100 according to exemplary embodiments of the inventive concept may include the plurality of vertical capacitors 232, each of which may have a core-shell structure and a circular pillar shape. Thus, an area occupied by a capacitor in the peripheral circuit region Peri may be reduced so that a proportion of the peripheral circuit region Peri relative to the entire non-volatile memory device 1100 may be reduced, and the non-volatile memory device may be downscaled and highly integrated. Also, charges from the first and second capacitor electrodes 234 and 236 may be accumulated in the capacitor insulating layer 238 included in each of the plurality of vertical capacitors 232 to generate the second capacitance C2 in the capacitor insulating layer 238. Thus, a higher capacitance (C1 and C2) may be generated along with the first capacitance C1 generated in the insulating layer 220 interposed between the pair of adjacent vertical capacitors 232 from among the plurality of vertical capacitors 232. Owing to the high capacitance (C1 and C2), the vertical non-volatile memory device 1100 may effectively adjust to an increase in pump capacity due to an increase in the number of stacked levels of memory cells.

Figure 11:
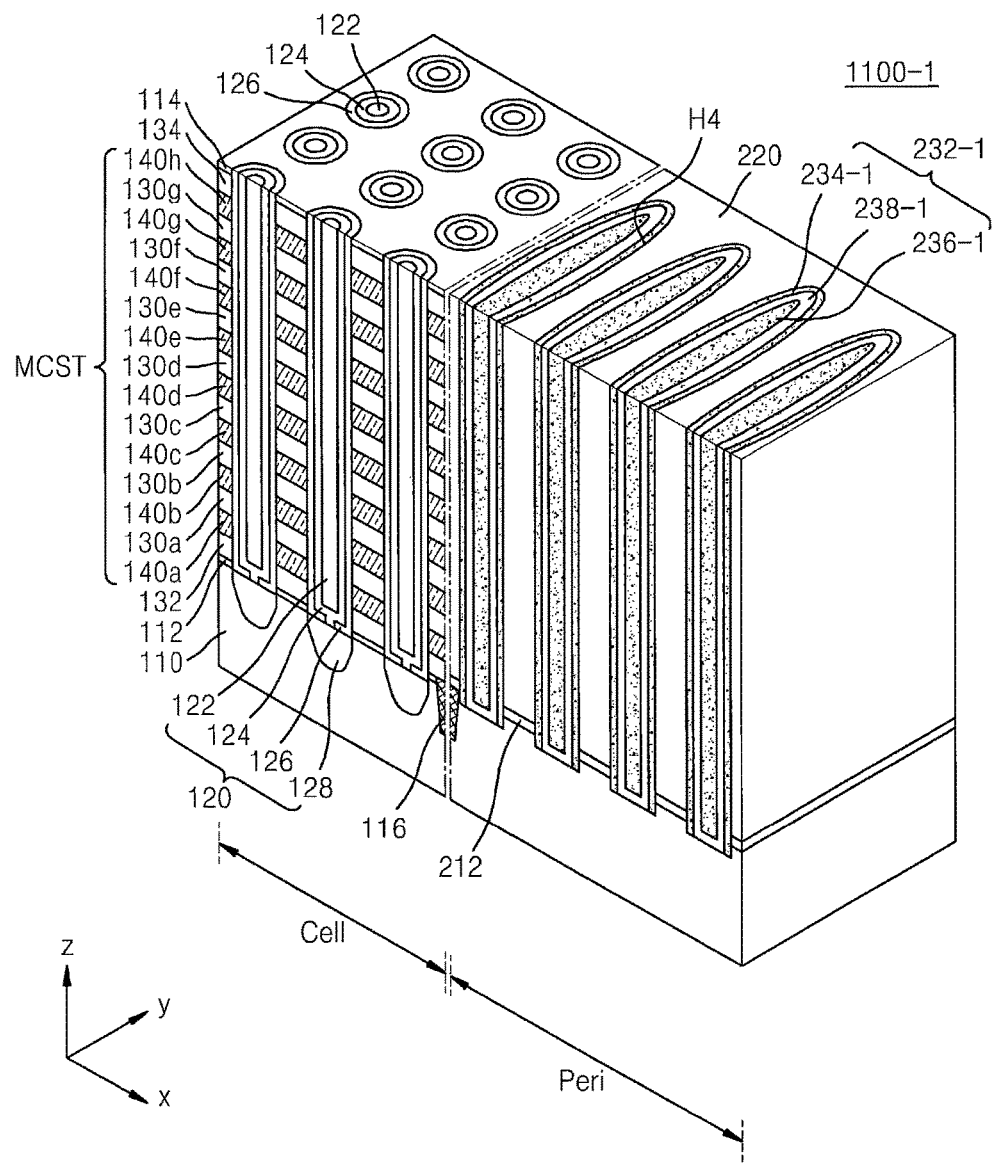

FIG. 11 is a perspective view of a vertical non-volatile memory device 1100-1 according to exemplary embodiments of the inventive concept. The vertical non-volatile memory device 1100-1 includes the same components as the vertical non-volatile memory device 1100 shown in FIG. 10 except that a plurality of vertical capacitors 232-1 do not have a circular pillar shape but a pillar shape having an elliptical lower surface. Hereinafter, descriptions of the same components as described with reference to FIG. 10 will be omitted.

Each of the plurality of vertical capacitors 232-1 may include a first capacitor electrode 234-1, a second capacitor electrode 236-2, and a capacitor insulating layer 238-1. Each of the plurality of vertical capacitors 232-1 may be formed in a pillar-type via hole H4 having an elliptical section parallel to an upper surface of a substrate 110. The first capacitor electrode 234-1 may be formed to a predetermined thickness to surround an inner sidewall of the via hole H4. The second capacitor electrode 236-1 may be surrounded with the first capacitor electrode 234-1 within the via hole H4 and have a pillar shape having an elliptical lower surface. The capacitor insulating layer 238-1 may be interposed between the first and second capacitor electrodes 234-1 and 236-1. Since methods and materials for forming the first capacitor electrode 234-1, the second capacitor electrode 236-1, and the capacitor insulating layer 238-1 are the same as methods and materials for forming the first capacitor electrode 234, the second capacitor electrode 236, and the capacitor insulating layer 238 described with reference to FIG. 10, repeated descriptions thereof are omitted here.

The plurality of vertical capacitors 232-1 may be arranged apart from one another in a first direction (x direction) parallel to the upper surface of the substrate 110 and extend in a third direction (z direction) vertical to the upper surface of the substrate 110. Charges may be accumulated in an insulating layer 220 interposed between a pair of adjacent vertical capacitors 232-1 from among the plurality of vertical capacitors 232-1 to generate capacitance. The capacitance may increase as the height of the plurality of vertical capacitors 232-1 increases, the planar area of the plurality of vertical capacitors 232-1 increases, and the thickness of the insulating layer 220 interposed between the pair of vertical capacitors 232-1 decreases. Also, charges may be accumulated in the capacitor insulating layer 238-1 interposed between the first and second capacitor electrodes 234-1 and 236-1 of each of the plurality of vertical capacitors 232-1 to generate capacitance. As described above with reference to FIG. 10, the capacitance may increase as the thickness of the capacitor insulating layer 238-1 interposed between the first and second capacitor electrodes 234-1 and 236-1 of each of the plurality of vertical capacitors 232-1 decreases.

Figure 12:
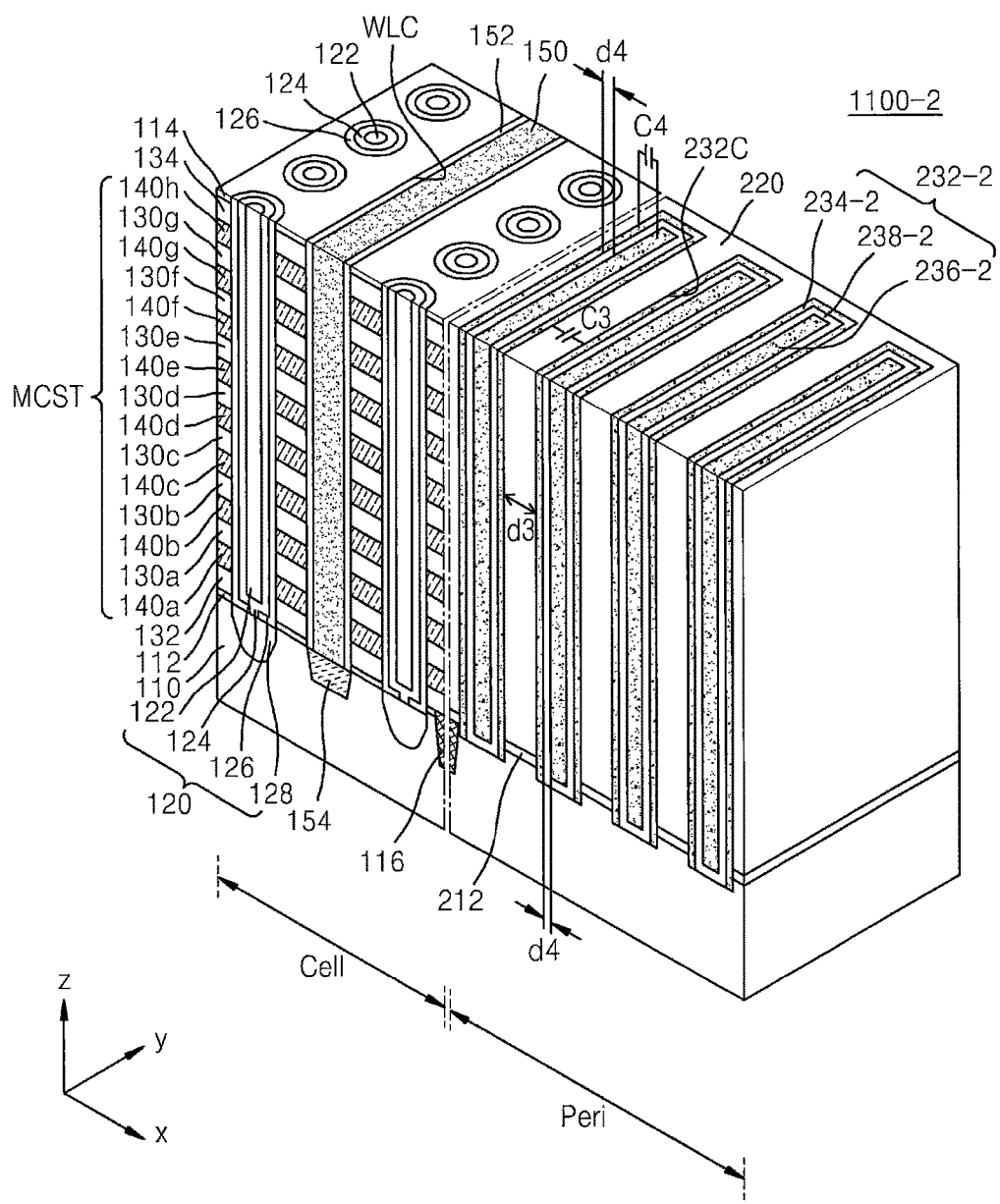

FIG. 12 is a perspective view of a vertical non-volatile memory device 1100-2 according to exemplary embodiments of the inventive concept. The vertical non-volatile memory device 1100-2 includes the same components as the vertical non-volatile memory device 1100 shown in FIG. 10 except that the vertical non-volatile memory device 1100-2 further includes a common source line 150 formed in a cell region Cell and common source line spacers 152 formed on both sidewalls of the common source line 150. Also, a plurality of vertical capacitors 232-2 may have substantially the same line shape as the common source line 150. Hereinafter, descriptions of the same components as described with reference to FIG. 10 will be omitted.

The common source line 150 may penetrate memory cell strings MCST in a third direction (z direction) vertical to an upper surface of a substrate 110, and extend in a second direction (y direction) parallel to the upper surface of the substrate 110. Since the common source line 150 and the common source line spacers 152 are the same as described with reference to FIG. 8, repeated descriptions thereof are omitted here.

The plurality of vertical capacitors 232-2 may be formed on the substrate 110 to penetrate an insulating layer 220 in the third direction (z direction) vertical to the upper surface of the substrate 110. The plurality of vertical capacitors 232-2 may extend in the second direction (y direction) parallel to the upper surface of the substrate 110 to be parallel to the common source line 150. The plurality of vertical capacitors 232-2 may be arranged a third distance d3 apart from one another in a first direction (x direction) parallel to the upper surface of the substrate 110 and perpendicular to the second direction (y direction). The plurality of vertical capacitors 232-2 may have a square pillar shape having a square lower surface. Each of the plurality of vertical capacitors 232-2 may include a first capacitor electrode 234-2, a second capacitor electrode 236-2, and a capacitor insulating layer 238-2.

The formation of the plurality of vertical capacitors 232-2 may include forming capacitor line cuts 232C using the same etching process as a process of etching a word line cut WLC for forming the common source line 150. The first capacitor electrode 234-2 may be formed by depositing at least one of metal materials including tungsten (W), tungsten nitride (WN), titanium (Ti), titanium nitride (TiN), tantalum (Ta), tantalum nitride (TaN), platinum (Pt), cobalt (Co), and aluminum (Al) or silicide materials including poly-Si, tungsten silicide (WSi), cobalt silicide (CoSi) and nickel silicide (NiSi) in a space formed by the capacitor line cut 232C. The first capacitor electrode 234-2 may be formed to a predetermined thickness on an inner sidewall of the capacitor line cut 232C by depositing the above-described metal materials or silicide materials using at least one selected from a CVD process, a PECVD process, and a PVD process.

The second capacitor electrode 236-2 may be formed in the capacitor line cut 232C to be parallel to the common source line 150 and surrounded with the first capacitor electrode 234-2. The second capacitor electrode 236-2 may be formed in the capacitor line cut 232C and have a square pillar shape having a square lower surface. The second capacitor electrode 236-2 may include the same material as the first capacitor electrode 234-2 or a different metal material or silicide material from the first capacitor electrode 234-2. A capacitor insulating layer 238-2 may be interposed between the first and second capacitor electrodes 234-2 and 236-2. The capacitor insulating layer 238-2 may have a width corresponding to a fourth distance d4 along the first direction (x direction) parallel to the upper surface of the substrate 110.

Charges may be accumulated in an insulating layer 220 interposed between a pair of adjacent vertical capacitors 232-2 from among the plurality of vertical capacitors 232-2 to generate a third capacitance C3. The third capacitance C3 may increase as the height of the plurality of vertical capacitors 232-2 increases, the planar area of the plurality of vertical capacitors 232-2 increases, and the thickness of the insulating layer 220 interposed between the pair of vertical capacitors 232-2 decreases. Also, charges may be accumulated in the capacitor insulating layer 238-2 interposed between the first and second capacitor electrodes 234-2 and 236-2 of each of the plurality of vertical capacitors 232-2 to generate a fourth capacitance C4. The fourth capacitance C4 may increase as the fourth distance d4, which corresponds to the width of the capacitor insulating layer 238-4 obtained in the first direction (x direction), decreases.

Figure 13:
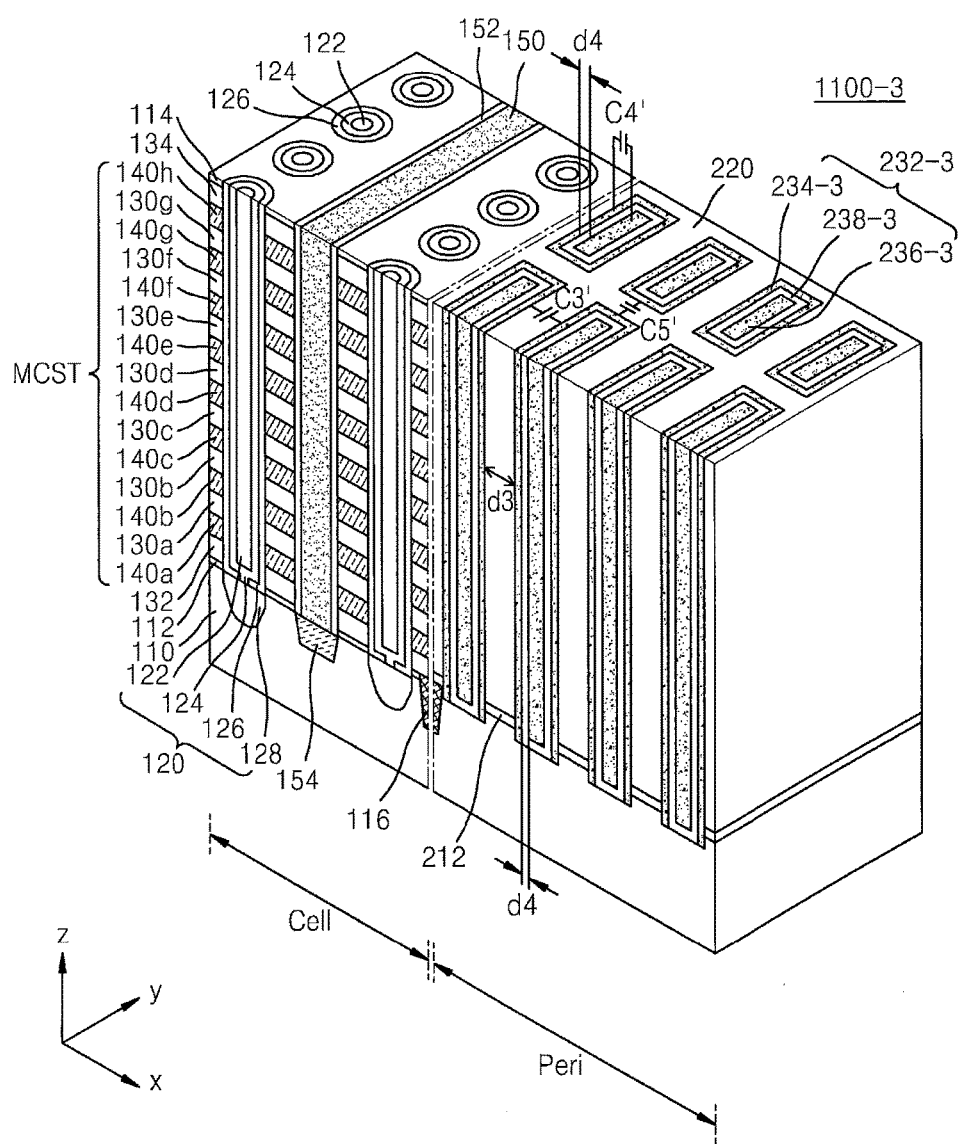

FIG. 13 is a perspective view of a vertical non-volatile memory device 1100-3 according to exemplary embodiments of the inventive concept. The vertical non-volatile memory device 1100-3 includes the same components as the vertical non-volatile memory device 11000-2 shown in FIG. 12 except that a plurality of vertical capacitors 232-3 are arranged apart from one another not only in a first direction (x direction) parallel to an upper surface of a substrate 110 but also in a second direction (y direction) parallel to the upper surface of the substrate 110 and perpendicular to the first direction. Hereinafter, descriptions of the same components as described with reference to FIG. 12 will be omitted.

Charges may be accumulated in an insulating layer 220 interposed between a pair of vertical capacitors 232-3 adjacently disposed in the first direction (x direction) from among the plurality of vertical capacitors 232-3 to generate a third capacitance C3'. Also, charges may be accumulated in a capacitor insulating layer 238-3 interposed between a first capacitor electrode 234-3 and a second capacitor electrode 236-3 of each of the plurality of vertical capacitors 232-3 to generate a fourth capacitance C4'. Furthermore, the plurality of vertical capacitors 232-3 may be arranged apart from one another not only in the first direction (x direction) but also in the second direction (y direction) so that charges can be accumulated in the insulating layer 220 interposed between a pair of vertical capacitors 232-3 adjacently disposed in the second direction (y direction) to generate a fifth capacitance C5'. The capacitances C3' and C5' may increase not only with a reduction in the width of the insulating layer 220 corresponding to a third distance d3 between the pair of vertical capacitors 232-3 adjacently disposed in the first direction (x direction) from among the plurality of vertical capacitors 232-3 but also with a reduction in the thickness of the insulating layer 220 corresponding to a fifth distance d5 between the pair of vertical capacitors 232-3 adjacently disposed in the second direction (y direction).

Thus, as described hereinabove with respect to FIGS. 1-13, a nonvolatile memory device according to some embodiments of the invention may include a plurality of spaced-apart strings of vertically arranged nonvolatile memory cells (MCST) on a memory cell region ("Cell") of a substrate 110. An electrically insulating layer 220 is provided on a peripheral circuit region ("Peri") of the substrate, which extends adjacent the memory cell region. As illustrated by FIGS. 1-13, a plurality of spaced-apart first capacitor electrodes 230, 230-1, 230-2, 230-3, 230-4, 230-5, 230-6, 230-7, 236, 236-1, 236-2 and 236-3 are provided on the peripheral circuit region. These capacitor electrodes extend vertically and at least partially through the electrically insulating layer 220 in a direction parallel to vertically extending channel regions in the plurality of spaced-apart strings of vertically arranged nonvolatile memory cells. As shown throughout these figures, the electrically insulating layer 220 operates as a capacitor dielectric region, which extends between each of the first capacitor electrodes. In addition, as shown by FIG. 4, a trench insulating layer 214 may be provided, which is embedded within the peripheral circuit region of the substrate 110, and the plurality of spaced-apart first capacitor electrodes 230-2 may extend through the electrically insulating layer 220 and into a portion of the trench insulating layer 214 extending below the surface of the substrate 110. As will be understood by those skilled in the art, this trench insulating layer 214 of FIG. 4 operates as an additional capacitor dielectric region, which extends between each of the first capacitor electrodes 230-2 and the underlying substrate 110 (e.g., semiconductor substrate).

Referring now to FIG. 10, additional embodiments of the invention utilize a plurality of annular-shaped second capacitor electrodes 234, which extend vertically and at least partially through the electrically insulating layer 220. As shown, each of the annular-shaped second capacitor electrodes 234 surrounds a corresponding one of the first capacitor electrodes 236, to thereby define a plurality of capacitors 232; which are surrounded by the electrically insulating layer 220. As further shown by FIG. 10, the vertically extending channel regions 124 are annular-shaped when viewed in a direction normal to the surface of substrate 110. In addition, each of the annular-shaped second capacitor electrodes 234 is separated from a corresponding one of the first capacitor electrodes 236 by an annular-shaped electrically insulating material 238 that operates as a capacitor dielectric region.

As further shown by FIG. 6, each of the plurality of spaced-apart capacitor electrodes 230-4 may be separated from the surface of the substrate 110 by a corresponding electrically conductive gate member 272, which itself is separated from the surface of the substrate by a lower electrically insulating layer 274. In some embodiments of the invention, this gate member 272 may be formed as a dummy control gate within a dummy gate structure.

Figure 14:
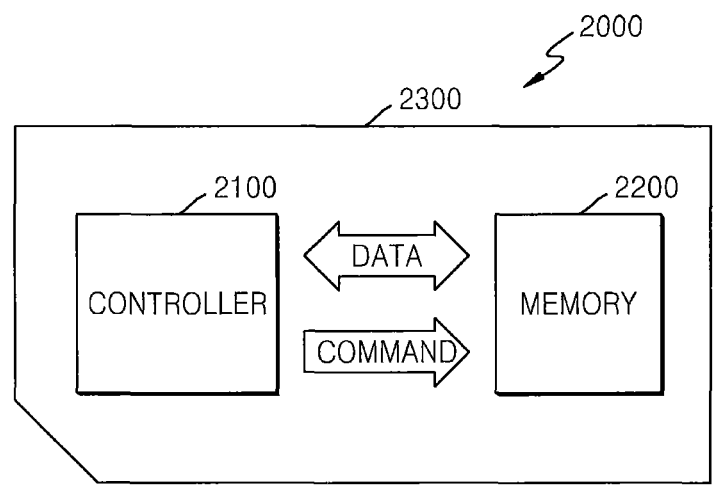
FIG. 14 is a schematic diagram of a memory card according to exemplary embodiments of the inventive concept.

FIG. 14 is a schematic diagram of a memory card 2000 according to exemplary embodiments of the inventive concept. Referring to FIG. 14, the memory card 2000 may include a controller 2100 and a memory 2200 embedded in a housing 2300. The controller 2100 and the memory 2200 may exchange electric signals. For example, the memory 2200 and the controller 2100 may transmit and receive data in response to commands from the controller 2100. Thus, the memory card 2000 may store the data in the memory 2200 or externally output the data from the memory 2200.

For example, the memory 2200 may include any one of the vertical non-volatile memory device 1000, 1000-1 through 1000-7, 1100, and 1100-1 through 1100-3 described with reference to FIGS. 1 through 13. The memory card 2000 may be used as a data storage medium for various portable devices. For example, the memory card 2000 may include a multimedia card (MMC) or a secure digital card (SD).

Figure 15:
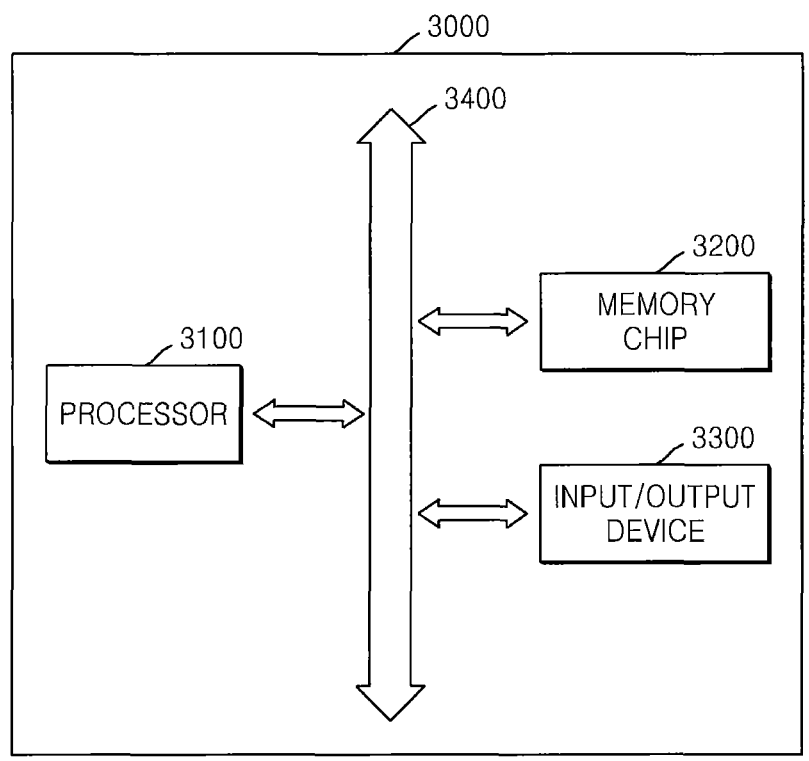
FIG. 15 is a block diagram of an electronic system according to exemplary embodiments of the inventive concept.

FIG. 15 is a block diagram of an electronic system 3000 according to exemplary embodiments of the inventive concept. Referring to FIG. 15, the electronic system 3000 may include a processor 3100, an input/output device 3300, and a memory chip 3200, which may communicate data with one another using a bus 3400. The processor 3100 may serve to execute programs and control the electronic system 3000. The input/output device 3300 may be used to input or output data in or from the electronic system 3000. The electronic system 3000 may be connected to an external device (e.g., a personal computer (PC) or a network) using the input/output device 3300 and exchange data with the external device. The memory chip 3200 may store codes and data required for operations of the processor 3100. For example, the memory chip 3200 may include any one of the vertical non-volatile memory device 1000, 1000-1 through 1000-7, 1100, and 1100-1 through 1100-3 described with reference to FIGS. 1 through 13.

The electronic system 3000 may constitute various electronic control apparatuses that need the memory chip 3200. For example, the electronic system 3000 may be used for a mobile phone, a MPEG-1 audio layer 3 (MP3) player, a navigation device, a solid-state disk (SSD), or household appliances.

While the inventive concept has been particularly shown and described with reference to exemplary embodiments thereof, it will be understood that various substitutions, modifications, and changes in form and details may be made therein without departing from the spirit and scope of the following claims.

What is claimed is:

1. A nonvolatile memory device, comprising:
a substrate having a cell region and a peripheral circuit region;
a memory cell string including a plurality of vertical memory cells formed in the cell region and a plurality of channel holes formed to penetrate the vertical memory cells in a first direction perpendicular to an upper surface of the substrate;
an insulating layer formed in the peripheral circuit region on the substrate at substantially the same level as an upper surface of the memory cell string; and
a plurality of capacitor electrodes formed on the peripheral circuit region to penetrate at least a portion of the insulating layer in the first direction, wherein the plurality of capacitor electrodes are arranged as a matrix along second and third directions parallel to the upper surface of the substrate.

2. A nonvolatile memory device, comprising:
a substrate having a cell region and a peripheral circuit region;
a memory cell string including a plurality of vertical memory cells formed in the cell region and a plurality of channel holes formed to penetrate the vertical memory cells in a first direction perpendicular to an upper surface of the substrate;
an insulating layer formed in the peripheral circuit region on the substrate at substantially the same level as an upper surface of the memory cell string; and
a plurality of capacitor electrodes formed on the peripheral circuit region to penetrate at least a portion of the insulating layer in the first direction, wherein the plurality of capacitor electrodes are arranged in at least one array along the first direction.

3. The device of claim 1, wherein a distance between two neighboring capacitors of the plurality of capacitors along the second direction is different from distance between two neighboring capacitors of the plurality of capacitors along the third direction.

4. The device of claim 1, wherein a distance between two neighboring capacitors of the plurality of capacitors along the second direction is substantially equal to a distance between two neighboring capacitors of the plurality of capacitors along the third direction.

5. The device of claim 1, wherein a distance between two neighboring capacitors of the capacitors is substantially equal to a distance between two neighboring channel holes of the channel holes.

6. The device of claim 5, wherein each of the plurality of capacitor electrodes has a circular pillar shape extending in the first direction.

7. The device of claim 5, wherein a lower surface of each of the plurality of capacitor electrodes has substantially same planar area as each of the channel holes.

8. The device of claim 2, wherein a lower surface of each of the plurality of capacitor electrodes has substantially same planar area as each of the plurality of channel holes.

9. The device of claim 8, wherein each of the plurality of capacitor electrodes has a pillar shape having a circular lower surface.

10. The device of claim 2, wherein a lower surface of each of the plurality of capacitor electrodes has a different planar area from planar areas of the plurality of channel holes.

11. The device of claim 10, wherein each of the plurality of capacitor electrodes has a pillar shape having an elliptical lower surface.

12. The device of claim 10, wherein each of the plurality of capacitor electrodes has a pillar shape having a polygonal lower surface.

* * * * *